(12) United States Patent
Satou et al.

(10) Patent No.: US 11,348,855 B2
(45) Date of Patent: May 31, 2022

(54) SEMICONDUCTOR COMPONENT AND POWER MODULE

(71) Applicant: CALSONIC KANSEI CORPORATION, Saitama (JP)

(72) Inventors: Yutaka Satou, Saitama (JP); Yasuyuki Ooi, Saitama (JP)

(73) Assignee: CALSONIC KANSEI CORPORATION, Saitama (JP)

( * ) Notice: Subject to any disclaimer, the term of this patent is extended or adjusted under 35 U.S.C. 154(b) by 888 days.

(21) Appl. No.: 16/097,143

(22) PCT Filed: Apr. 27, 2017

(86) PCT No.: PCT/JP2017/016696
§ 371 (c)(1),
(2) Date: Oct. 26, 2018

(87) PCT Pub. No.: WO2017/188368
PCT Pub. Date: Nov. 2, 2017

(65) Prior Publication Data
US 2021/0225724 A1    Jul. 22, 2021

(30) Foreign Application Priority Data

Apr. 27, 2016 (JP) .............................. JP2016-089226

(51) Int. Cl.
*H01L 23/36* (2006.01)
*H01L 23/31* (2006.01)
(Continued)

(52) U.S. Cl.
CPC .............. *H01L 23/36* (2013.01); *H01L 23/31* (2013.01); *H01L 23/473* (2013.01); *H01L 29/7393* (2013.01); *H02M 1/32* (2013.01)

(58) Field of Classification Search
CPC ....... H01L 23/36; H01L 23/31; H01L 23/473; H01L 29/7393; H02M 1/32
See application file for complete search history.

(56) References Cited

U.S. PATENT DOCUMENTS

| | | | |
|---|---|---|---|
| 5,672,910 A | 9/1997 | Majumdar et al. | |
| 2004/0113248 A1* | 6/2004 | Ito | H05K 3/3426 257/678 |

(Continued)

FOREIGN PATENT DOCUMENTS

| | | |
|---|---|---|
| JP | H09-129796 A | 5/1997 |
| JP | H09-153574 A | 6/1997 |

(Continued)

*Primary Examiner* — Peniel M Gumedzoe
(74) *Attorney, Agent, or Firm* — Foley & Lardner LLP

(57) ABSTRACT

A semiconductor component includes: a semiconductor device; an insulating molded portion configured to encapsulate the semiconductor device; a terminal connected to the semiconductor device, the terminal being configured to project out from the insulating molded portion; and a cooler mounted with the insulating molded portion such that the semiconductor device is cooled; wherein a recessed portion is formed in a surface of the cooler on which the insulating molded portion is mounted so as to extend from a position facing the terminal to a position at inner side of an end portion of the insulating molded portion.

14 Claims, 27 Drawing Sheets

(51) Int. Cl.
*H01L 29/739* (2006.01)
*H02M 3/158* (2006.01)
*H02M 1/32* (2007.01)
*H01L 23/473* (2006.01)

(56) References Cited

U.S. PATENT DOCUMENTS

| | | |
|---|---|---|
| 2007/0205503 A1 | 9/2007 | Baek et al. |
| 2010/0059870 A1 | 3/2010 | Wen et al. |
| 2011/0227205 A1 | 9/2011 | Lu et al. |
| 2011/0304039 A1* | 12/2011 | Miyamoto .............. H01L 24/73 257/712 |
| 2012/0217616 A1 | 8/2012 | Matsuoka |
| 2013/0258602 A1 | 10/2013 | Hatai |
| 2016/0315037 A1 | 10/2016 | Kadoguchi et al. |

FOREIGN PATENT DOCUMENTS

| | | |
|---|---|---|
| JP | 2008-186890 A | 8/2008 |
| JP | 2011-258632 A | 12/2011 |
| JP | 2012-178504 A | 9/2012 |
| JP | 2013-110181 A | 6/2013 |
| JP | 2015-115464 A | 6/2015 |
| WO | WO-2012/090307 A1 | 7/2012 |
| WO | WO-2015/043795 A2 | 4/2015 |

\* cited by examiner

SEMICONDUCTOR COMPONENT AND POWER MODULE

CROSS-REFERENCE TO RELATED APPLICATIONS

This application is a National Phase of International Patent Application No. PCT/JP2017/016696, filed Apr. 27, 2017, the contents of which are herein incorporated by reference in their entirety.

TECHNICAL FIELD

The present invention relates to a semiconductor component and to a power module applied to the semiconductor component.

BACKGROUND ART

JP2015-115464A discloses a semiconductor component used as a power converter. This semiconductor component includes IGBTs (Insulated Gate Bipolar Transistor), free-wheeling diodes, and a resin portion that encapsulate these components. In this semiconductor component, power terminals and out put terminals are drawn out from side surfaces of the resin portion so as to achieve reduction in the thickness thereof.

SUMMARY OF INVENTION

Because semiconductor components such as power converters etc. generate heat when operated, it is required to cool the semiconductor components. However, as the semiconductor component disclosed in JP2015-115464A, when the semiconductor component in which the power terminals and the out put terminals are drawn out from the side surfaces of the resin portion is to be mounted on a cooler, predetermined distances need to be secured between a surface of the cooler and respective outputs to achieve an insulation therebetween. Especially, as the size and the thickness of the semiconductor components is reduced, the distances between the terminals and the cooler are also expected to be reduced, and therefore, an insulation problem between them becomes more important.

An object of the present invention is to achieve insulation between a cooler and a terminal.

According to one aspect of the present invention, a semiconductor component includes: a semiconductor device; an insulating molded portion configured to encapsulate the semiconductor device; a terminal connected to the semiconductor device, the a terminal being configured to project out from the insulating molded portion; and a cooler mounted with the insulating molded portion such that the semiconductor device is cooled; wherein a recessed portion is formed in a surface of the cooler on which the insulating molded portion is mounted so as to extend from a position facing the terminal to a position at inner side of an end portion of the insulating molded portion.

In the above-mentioned aspect, the cooler that cools the semiconductor device through a bottom portion of the insulating molded portion has the recessed portion extending from the position facing the terminal to the position at the inner side of the end portion of the insulating molded portion. By providing this recessed portion, as compared with the case in which the recessed portion is not provided, the distance between the cooler and the terminal is increased. Therefore, it is possible to improve an insulation reliability between the cooler and the terminal.

DESCRIPTION OF EMBODIMENTS

A power converter 1 to which a semiconductor component 100, 200, or 300 according to embodiments of the present invention is applied will be described below with reference to the drawings.

An overall configuration of the power converter 1 will be described first with reference to FIGS. 1 to 3.

Figure 1:
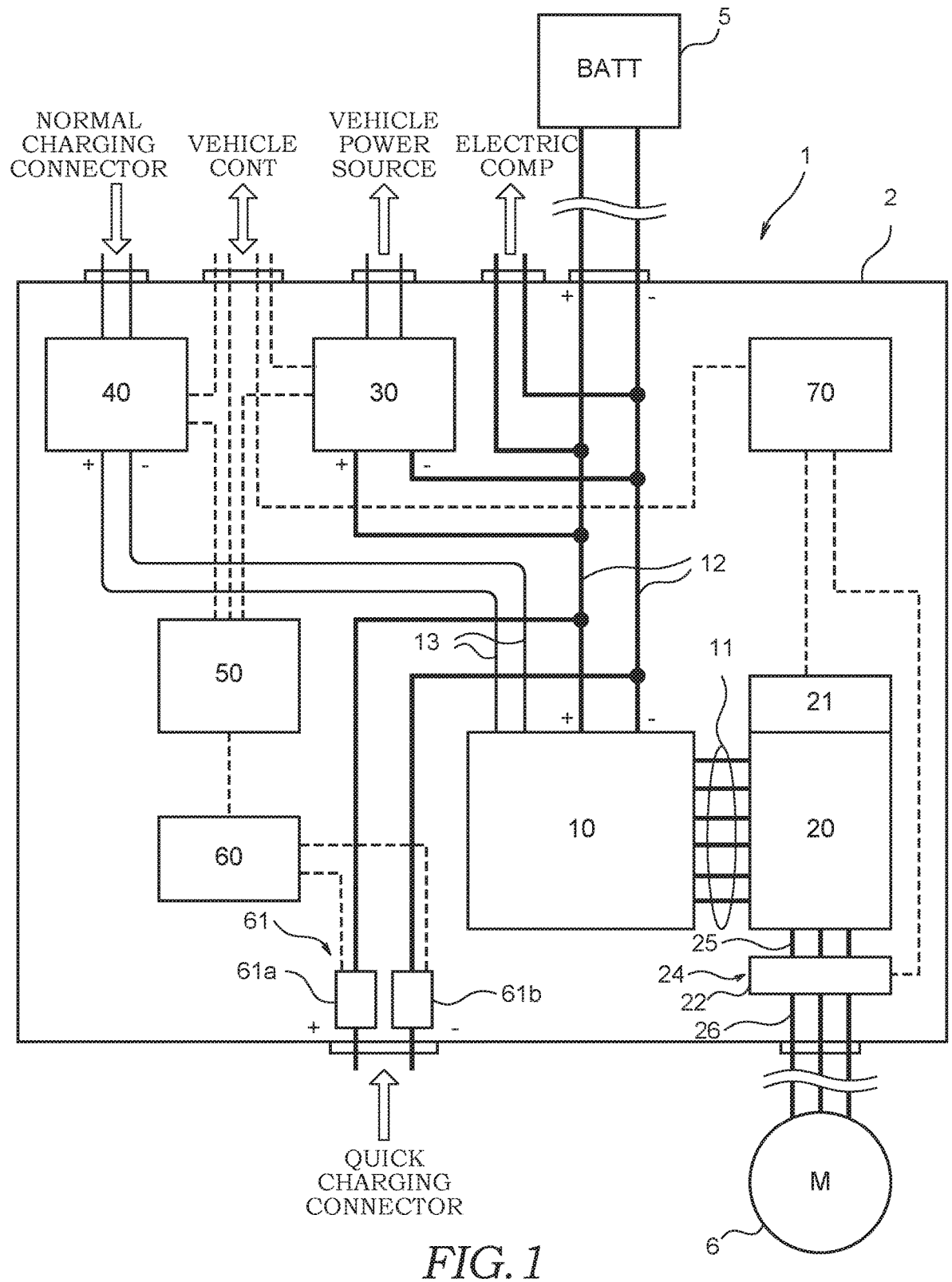
FIG. 1 is a block diagram for explaining a function of a power converter to which a semiconductor component according to an embodiment of the present invention is applied.

As shown in FIG. 1, the power converter 1 is mounted on an electric vehicle or a plug-in hybrid vehicle (electric automobile) and converts direct-current electric power from a battery (power storage apparatus) 5 to alternating-current electric power suitable for driving a motor generator (load) 6 as a rotating electric machine. The motor generator 6 is driven by the electric power supplied from the power converter 1.

The power converter 1 converts regenerative electric power (alternating-current electric power) from the motor generator 6 to direct-current electric power and charges the battery 5 therewith. In addition, the power converter 1 charges the battery 5 by supplying electric power from an external charging connector (not shown) provided on a vehicle via a quick charging connector 63 or a normal charging connector 81.

The battery 5 is formed of, for example, a lithium ion secondary battery. The battery 5 supplies direct-current electric power to the power converter 1, and the battery 5 is charged by direct-current electric power supplied by the power converter 1. The voltage of the battery 5 varies over a range of, for example, from 240 V to 400 V, and the battery 5 is charged by inputting higher voltage than this voltage.

The motor generator 6 is formed of, for example, a permanent magnet synchronous motor. The motor generator 6 is driven by alternating-current electric power supplied from the power converter 1. When the vehicle is driven, the motor generator 6 rotationally drives a driving wheel of the vehicle (not shown). When the vehicle slows down, the motor generator 6 functions as a generator and generates regenerative electric power.

Figure 2:
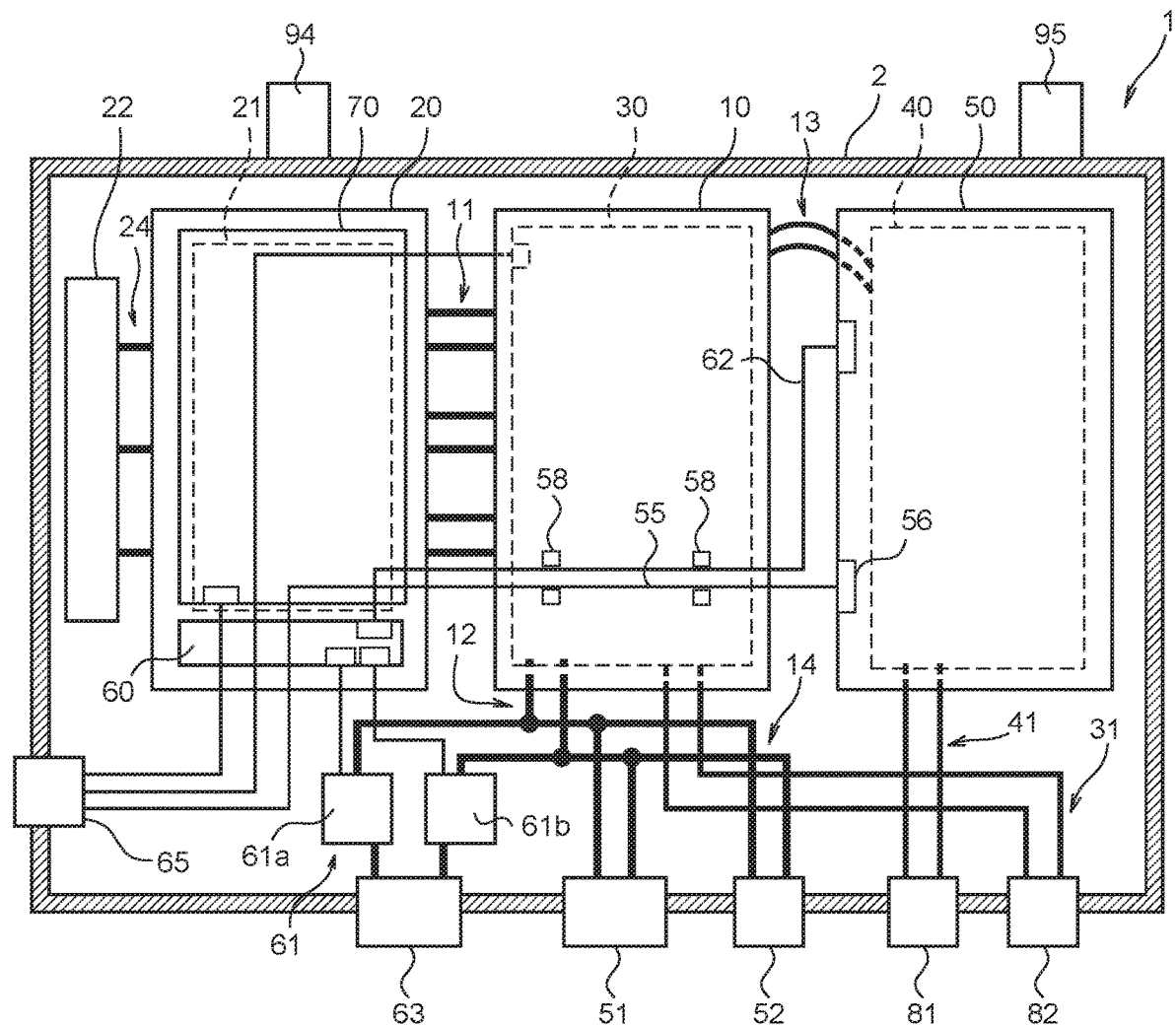
FIG. 2 is a sectional view in a horizontal plane for explaining a configuration of the power converter.
Figure 3:
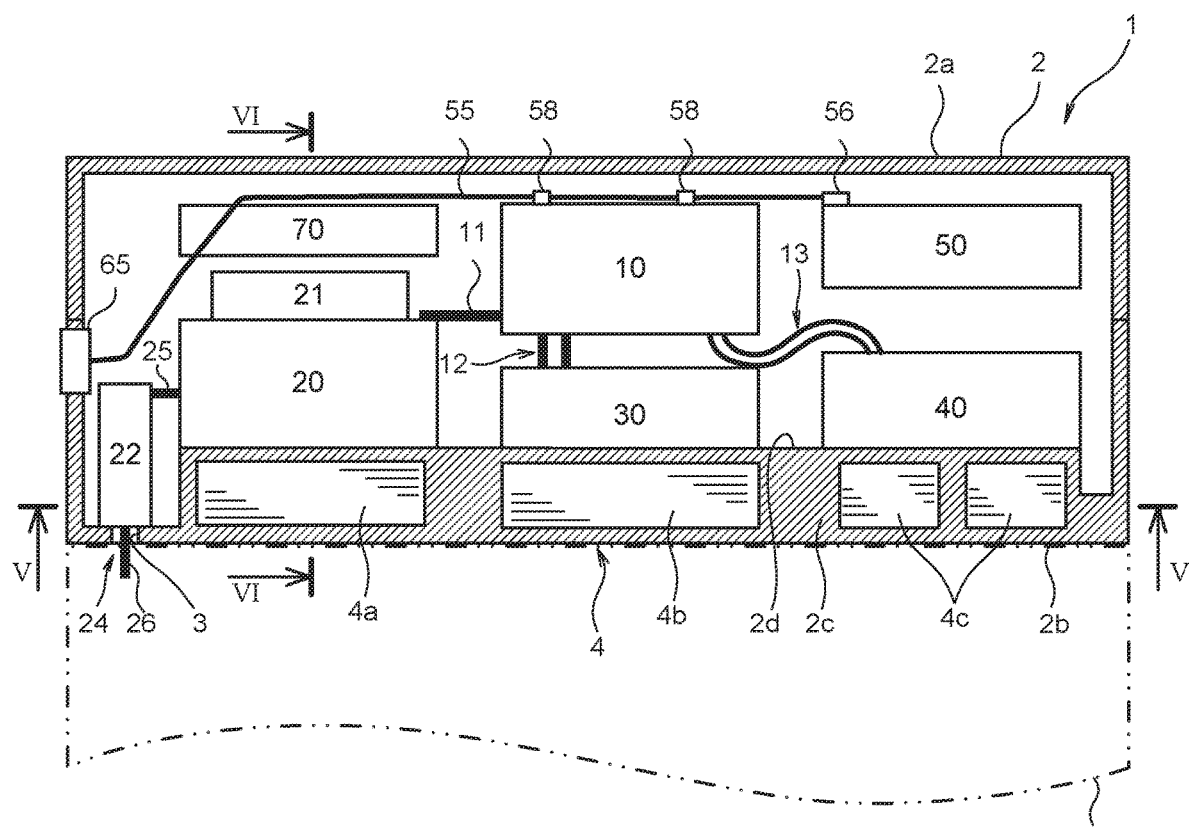
FIG. 3 is a sectional view from the side for explaining the configuration of the power converter.

As shown in FIGS. 2 and 3, the power converter 1 is provided with a box-shaped case 2 having a bottom portion (mounting portion) 2c. The power converter 1 includes, in the case 2, a capacitor module (smoothing capacitor) 10, a power module 20, a DC/DC converter 30, a charger 40, a DC/DC charge controller 50, and an inverter controller 70. These components are respectively electrically connected by bus bars or wires.

As shown in FIG. 3, the case 2 is formed of a bottom case 2b having an opening in a top surface and of an upper case 2a that closes the opening of the bottom case 2b. In the bottom case 2b, the power module 20, the DC/DC converter 30, and the charger 40 are provided so as to be in contact with a cooling surface 2d of the bottom portion 2c.

The bottom case 2b has a coolant-water flow channel (cooling medium flow channel) 4. Coolant water (cooling medium) flows through the coolant-water flow channel 4. The coolant-water flow channel 4 is formed in the bottom portion 2c. The coolant water flowing through the coolant-water flow channel 4 cools the power module 20, the DC/DC converter 30, and the charger 40 that are mounted on the cooling surface 2d directly above the coolant-water flow channel 4. The coolant-water flow channel 4 has a power module cooling portion 4a formed along the power module 20, a DC/DC converter cooling portion 4b formed along the DC/DC converter 30, and a charger cooling portion 4c formed along the charger 40.

An outer surface of the bottom portion 2c of the bottom case 2b faces the motor generator 6. The bottom portion 2c of the bottom case 2b has a through hole 3 through which output bus bars (bus bar module) 24, which will be described later, are inserted. The through hole 3 is formed at a region of the bottom case 2b other than the region in which the coolant-water flow channel 4 is formed. Thus, compared with a case in which the through hole 3 is formed in the region in which the coolant-water flow channel 4 is formed, there is no need to provide a sealing etc. for the through hole 3, and therefore, it is possible to reduce the size of the bottom case 2b and to ensure sealing performance for the coolant water.

The capacitor module 10 is attached to the bottom case 2b so as to straddle over the DC/DC converter 30. In FIG. 3, leg parts of the capacitor module 10 to be attached to the bottom case 2b are omitted in the illustration. The capacitor module 10 is formed of a plurality of capacitor devices. The capacitor module 10 smoothes, for example, voltage of direct-current electric power supplied from the battery 5 and voltage of regenerative electric power regenerated by the motor generator 6 via the power module 20. As described above, the capacitor module 10 performs removal of noise and suppression of voltage fluctuation by smoothing the voltage. The capacitor module 10 includes first bus bars 11, second bus bars 12, and electric power wires 13.

The power module 20, the DC/DC converter 30, and the charger 40 are arranged around the capacitor module 10. Specifically, the capacitor module 10 is arranged between the power module 20 and the charger 40 in the case 2. The capacitor module 10 is layered with the DC/DC converter 30, and the DC/DC converter 30 is arranged below the capacitor module 10. The charger 40 is layered with the DC/DC charge controller 50, and the charger 40 is arranged below the DC/DC charge controller 50.

The first bus bars 11 project out towards the side from one side surface of the capacitor module 10 and are connected to the power module 20. The power module 20 are connected to the first bus bars 11 directly by using screws, etc. The second bus bars 12 are connected to the DC/DC converter 30, relays 61, the battery 5, and an electric compressor (not shown) (see FIG. 1). The electric power wires 13 are connected to the charger 40. The first bus bars 11, the second bus bars 12, and the electric power wires 13 share the positive electrode and the negative electrode in the capacitor module 10.

The second bus bars 12 project downwards from a bottom surface of the capacitor module 10. The second bus bars 12 are connected, by using screws, directly to the DC/DC converter 30 that is arranged so as to be layered below the capacitor module 10. The second bus bars 12 are connected to a positive-side relay 61a and a negative-side relay 61b.

As shown in FIG. 2, the second bus bars 12 are respectively connected via bus bars 14 to a battery-side connector 51 connected to the battery 5 and a compressor-side connector 52 connected to the electric compressor.

The electric power wires 13 are extended from the side surface of the capacitor module 10 opposite from the first bus bars 11 towards the side. The electric power wires 13 are flexible cables having bendability and are connected to the charger 40. The charger 40 is connected to the normal charging connector 81 via bus bars 41.

A signal line connector 65 allows connection between the outside of the case 2 and a signal line 55 connected to the DC/DC converter 30, the charger 40, the DC/DC charge controller 50, and the inverter controller 70.

The signal line 55 connects the signal line connector 65 and the DC/DC charge controller 50. The signal line 55 is connected to a connector 56 of the DC/DC charge controller 50 by extending through a top surface of the capacitor module 10 together with a signal line 62 provided from the DC/DC charge controller 50 to a relay controller 60. A plurality of guide parts 58 for supporting the signal line 55 and the signal line 62 are formed on the top surface of the capacitor module 10.

Figure 5:
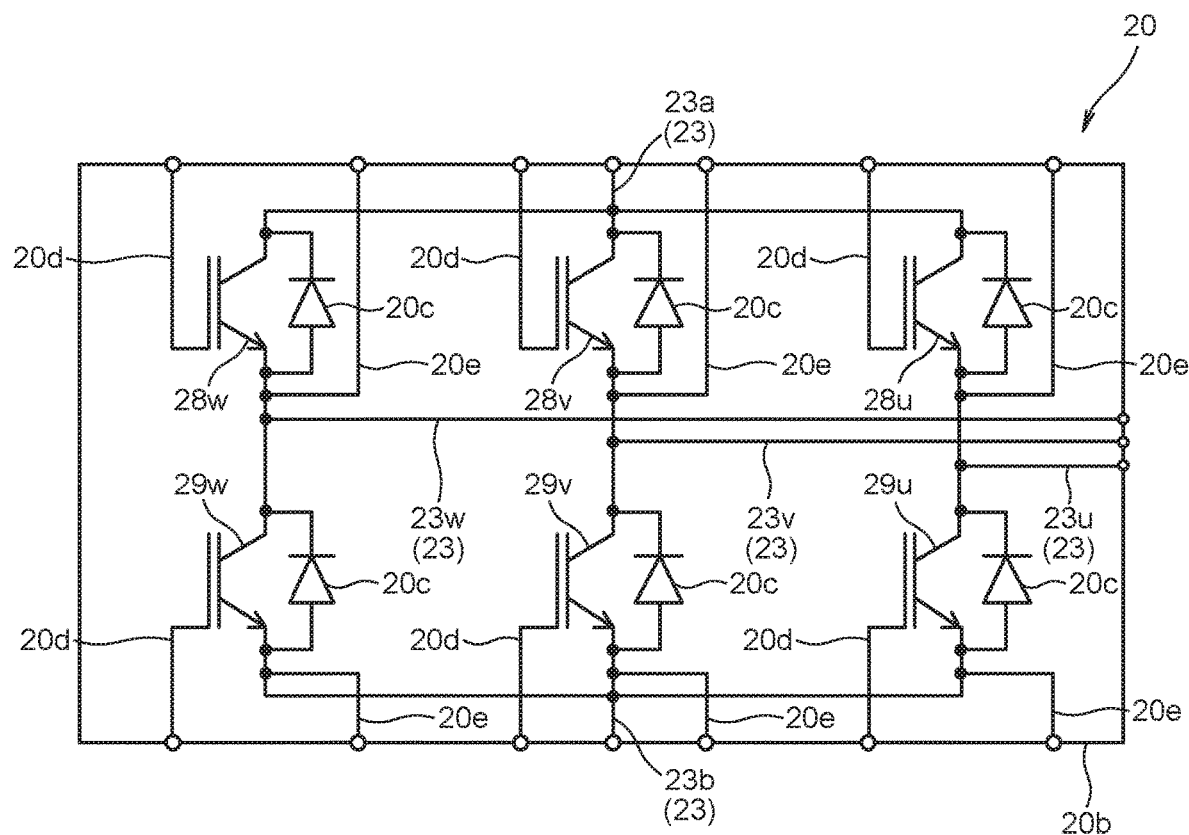
FIG. 5 is a circuit diagram of the power module.

The power module 20 has IGBTs (Insulated Gate Bipolar Transistors) 28u, 29u, 28v, 29v, 28w, and 29w as a plurality of power devices (semiconductor devices) (see FIG. 5). The power module 20 performs switching control of ON/OFF of the IGBTs 28u to 29w, thereby performing conversion between direct-current electric power from the battery 5 and alternating-current electric power from the motor generator 6 in a mutual manner. The ON/OFF control of the IGBTs 28u to 29w is performed by a driver substrate 21 provided on the power module 20. The driver substrate 21 is layered on a top surface of the power module 20. The inverter controller 70 and the relay controller 60 are arranged above the driver substrate 21.

The power module 20 is connected to the first bus bars 11 of the capacitor module 10. The three-phase output bus bars 24 formed of a U-phase, a V-phase, and a W-phase are connected to the power module 20.

As shown in FIG. 3, the output bus bars 24 have power module terminals 25 connected to the power module 20, motor terminals (load terminals) 26 connected to the motor generator 6, and a current sensor 22 that detects electric current through the output bus bars 24. The output bus bars 24 are connected to the side surface of the power module 20 opposite from the first bus bars 11. The output bus bars 24 are respectively connected to the U-phase, the V-phase, and the W-phase of the power module 20 directly, and output three-phase alternating-current electric power to the motor generator 6.

In the output bus bars 24, the power module terminals 25 and the motor terminals 26 are formed in mutually crossing directions. Specifically, the motor terminals 26 are connected to the motor generator 6 arranged below the output bus bars 24. The power module terminals 25 are connected to the power module 20 arranged on the side of the output bus bars 24. Thus, the motor terminals 26 are formed so as to extend in the crossing direction with respect to the power module terminals 25 at the right angle.

The output bus bars 24 are accommodated in the case 2. Tip ends of the motor terminals 26 are inserted into the through hole 3 of the bottom portion 2c of the case 2 and exposed to the outside. With such a configuration, the motor terminals 26 can be connected via harnesses, etc. (not shown) to the motor generator 6.

As shown in FIG. 1, the inverter controller 70 outputs to the driver substrate 21 a signal for operating the power module 20 on the basis of an instruction from a controller (not shown) of the vehicle and on the basis of detection results of the electric current of the U-phase, the V-phase, and the W-phase from the current sensor 22. The driver substrate 21 controls the power module 20 on the basis of the signal from the inverter controller 70. An inverter module that performs conversion between direct-current electric power and alternating-current electric power in a mutual manner is formed of the inverter controller 70, the driver substrate 21, the power module 20, and the capacitor module 10.

As shown in FIG. 2, the DC/DC converter 30 is provided so as to face the output bus bars 24 such that the power module 20 is sandwiched therebetween. The DC/DC converter 30 is connected to a vehicle-side connector 82 via bus bars 31. The vehicle-side connector 82 is connected to harnesses, etc. for supplying direct-current power supply output from the DC/DC converter 30 to respective parts of the vehicle.

The DC/DC converter 30 converts, when the vehicle is driven (when the power module 20 is driven) or stopped, voltage of direct-current electric power supplied from the battery 5 and supplies it to other devices. The DC/DC converter 30 decreases voltage of direct-current electric power from the battery 5 (for example, 400 V) to 12 V direct-current electric power. Direct-current electric power voltage of which has been decreased is supplied as a power supply to a controller, lighting, fan, and so forth mounted on the vehicle. The DC/DC converter 30 is connected to the capacitor module 10 and the battery 5 via the second bus bars 12.

The charger 40 is provided so as to face the power module 20 such that the DC/DC converter 30 is sandwiched therebetween. The charger 40 converts external power supply (for example, AC 100 V or 200 V), which is supplied from the external charging connector provided in the vehicle via the normal charging connector 81, to direct-current electric power (for example, 500 V). Direct-current electric power converted by the charger 40 is supplied through the electric power wires 13 to the battery 5 via the capacitor module 10. With such a configuration, the battery 5 is charged.

The DC/DC charge controller 50 controls driving of the motor generator 6 and charging of the battery 5 by the power converter 1. Specifically, on the basis of the instruction from the controller of the vehicle, the DC/DC charge controller 50 controls the charging of the battery 5 by the charger 40 via the normal charging connector 81, charging of the battery 5 via a quick charging connector 63, and the driving of the motor generator 6.

The relay controller 60 is controlled by the DC/DC charge controller 50 and controls ON/OFF of the relays 61. The relays 61 are formed of the positive-side relay 61a and the negative-side relay 61b. The relays 61 allows connection when the external charging connector provided in the vehicle is connected via the quick charging connector 63 and supplies, to the second bus bars 12, direct-current electric power (for example 500 V) supplied from the quick charging connector 63. The battery 5 is charged by direct-current electric power thus supplied.

The semiconductor components 100, 200, and 300 according to the first to third embodiments of the present invention will be described below with reference to FIGS. 4 to 13c.

First Embodiment

The semiconductor component 100 according to a first embodiment of the present invention will be described first with reference to FIGS. 4 to 9C.

Figure 4:
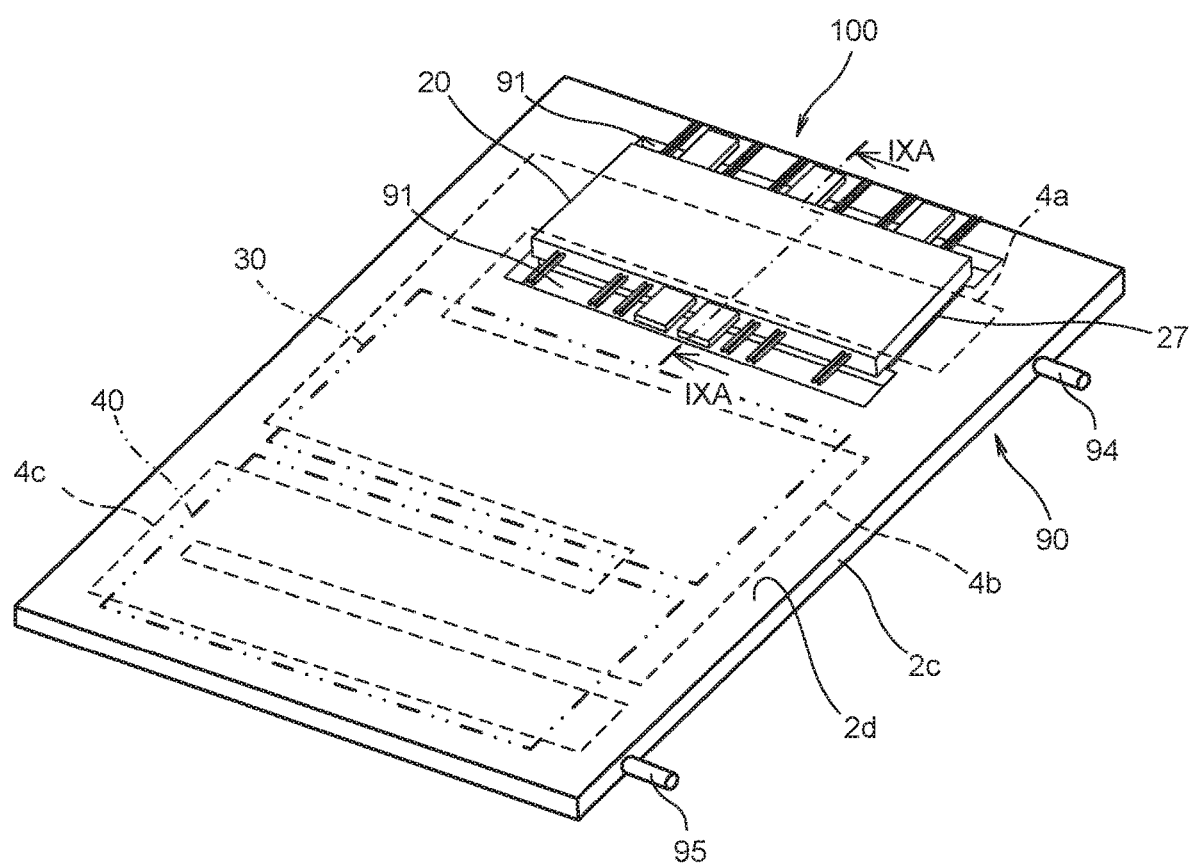
FIG. 4 is a perspective view for explaining a state in which a power module is arranged on a cooler.

As shown in FIG. 4, the semiconductor component 100 includes the power module 20 and a cooler 90 that is formed in a part of the bottom case 2b for cooling the power module 20.

Figure 6:
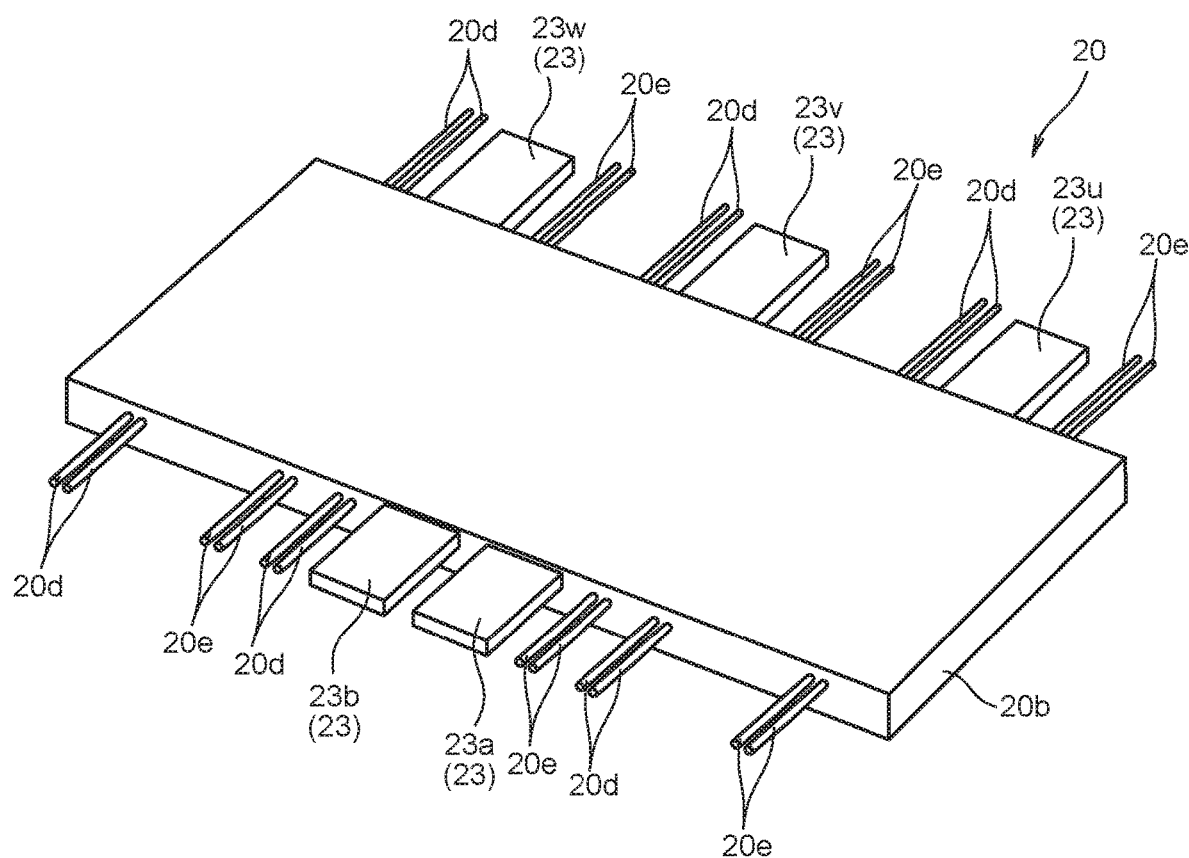
FIG. 6 is a perspective view seeing-through an insulating molded portion in the power module.
Figure 7:
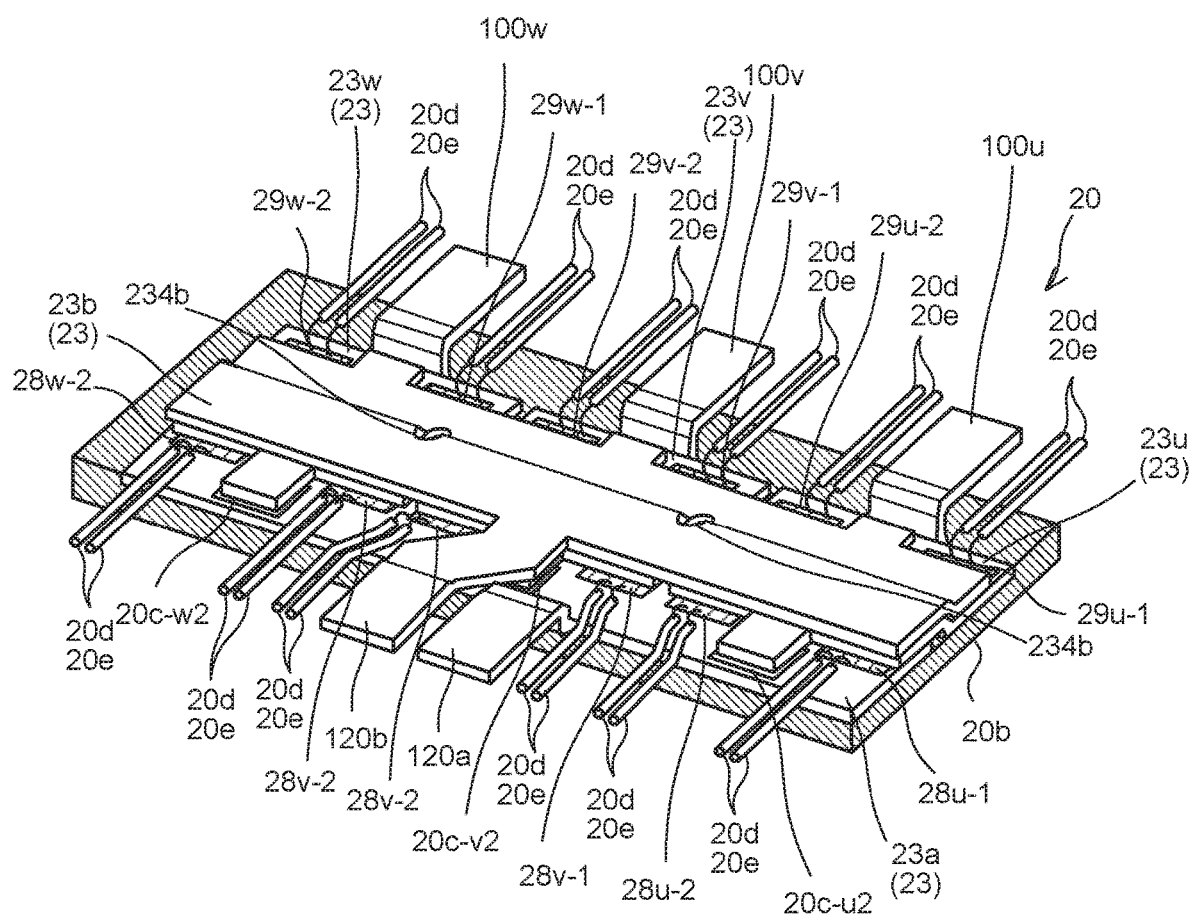
FIG. 7 is a see-through perspective view seeing-through the insulating molded portion in the power module.

As shown in FIGS. 5 and 6, the power module 20 includes the IGBTs 28u to 29w and a resin molded portion 20b serving as an insulating molded portion that encapsulates the IGBTs 28u to 29w. The resin molded portion 20b is formed by a transfer molding of a non-conductive resin.

The power module 20 includes a positive-electrode (upper side) bus bar 23a, a negative-electrode (lower side) bus bar 23b, a U-phase bus bar 23u, a V-phase bus bar 23v, and a W-phase bus bar 23w that serve as terminals that are respectively connected to the IGBTs 28u to 29w and project out from the side of the resin molded portion 20b. The positive-electrode bus bar 23a and the negative-electrode bus bar 23b are drawn out from the same side surface of the resin molded portion 20b and are connected to the capacitor module 10 via the first bus bars 11. The U-phase bus bar 23u, the V-phase bus bar 23v, and the W-phase bus bar 23w are drawn out from the side surface of the resin molded portion 20b at opposite side from the side surface from which the positive-electrode bus bar 23a and the negative-electrode bus bar 23b are drawn out, and they are respectively connected to the power module terminals 25 of the output bus bars 24.

The power module 20 converts direct-current electric power to alternating-current electric power. Specifically, the power module 20 is mounted on the vehicle (not shown) to convert direct-current electric power from the battery 5 to alternating-current electric power and supplies it to the motor generator 6. In addition, the power module 20 converts regenerative electric power (alternating-current electric power) from the motor generator 6 to direct-current electric power such that the battery 5 can be charged therewith. As described above, the power module 20 performs conversion between direct-current electric power and alternating-current electric power in a mutual manner.

As shown in FIG. 5, the power module 20 includes a plurality of switching devices 28u to 29w formed of sets of upper arms and lower arms that respectively correspond to the U-phase, the V-phase, and the W-phase, diodes 20c that are respectively connected to the switching devices 28u to 29w in parallel, and the resin molded portion 20b that encapsulates the switching devices 28u to 29w and the diodes 20c (see FIG. 6).

Specifically, the power module 20 includes the switching devices 28u and 29u that correspond to the U-phase, the switching devices 28v and 29v that correspond to the V-phase, and the switching devices 28w and 29w that correspond to the W-phase.

The power module 20 includes bus bars 23 serving as a plurality of conductive plates. The bus bars 23 include the positive-electrode bus bar 23a, the negative-electrode bus bar 23b, the U-phase bus bar 23u, the V-phase bus bar 23v, and the W-phase bus bar 23w that are respectively connected to the switching devices 28u to 29w. The bus bars 23 are mutually insulated by the resin molded portion 20b. In this configuration, the U-phase bus bar 23u, the V-phase bus bar 23v, and the W-phase bus bar 23w serve as first conductive plates, the positive-electrode bus bar 23a serves as a second conductive plate, and the negative-electrode bus bar 23b serves as a third conductive plate. A plurality of (three) first conductive plates are provided in correspondence to the respective (three) phases.

The switching devices 28u to 29w are each connected to signal lines 20d through which control signals for switching are input and output and signal lines 20e through which signals for temperature sensor and current sensor are input and output. The signal lines 20d and 20e and the bus bars 23 project out towards the side of the resin molded portion 20b. The positive-electrode bus bar 23a and the negative-electrode bus bar 23b are connected to bus bars on the battery side (not shown). The U-phase bus bar 23u, the V-phase bus bar 23v, and the W-phase bus bar 23w are connected to the motor generator 6 through output bus bars (not shown).

As shown in FIG. 6, the power module 20 is formed to have a rectangular shape having a thin plate shape. The positive-electrode bus bar 23a and the negative-electrode bus bar 23b project out from a first side surface of the power module 20. The U-phase bus bar 23u, the V-phase bus bar 23v, and the W-phase bus bar 23w project out from a second side surface of the power module 20 positioned at the opposite side from the first side surface. The signal lines 20d and 20e respectively project out from the first side surface form which the positive-electrode bus bar 23a and the negative-electrode bus bar 23b project out in the same directions as each of the bus bars, or the signal lines 20d and 20e respectively project out from the second side surface from which the U-phase bus bar 23u, the V-phase bus bar 23v, and the W-phase bus bar 23w project out in the same directions as each of the bus bars. The positive-electrode bus bar 23a, the negative-electrode bus bar 23b, the U-phase bus bar 23u, the V-phase bus bar 23v, and the W-phase bus bar 23w project out from the power module 20 at substantially the same positions in the thickness direction of the power module 20.

The power module 20 has a thin plate shape. The switching devices 28u to 29w and the diodes 20c are arranged in the power module 20 so as to be aligned.

Each of the switching devices shown in the circuit diagram in FIG. 5 is, in practice, formed of a pair of switching devices connected in parallel. Similarly, each of the diodes shown in the circuit diagram in FIG. 5 is, in practice, formed of a pair of diodes connected in parallel.

Figure 8:
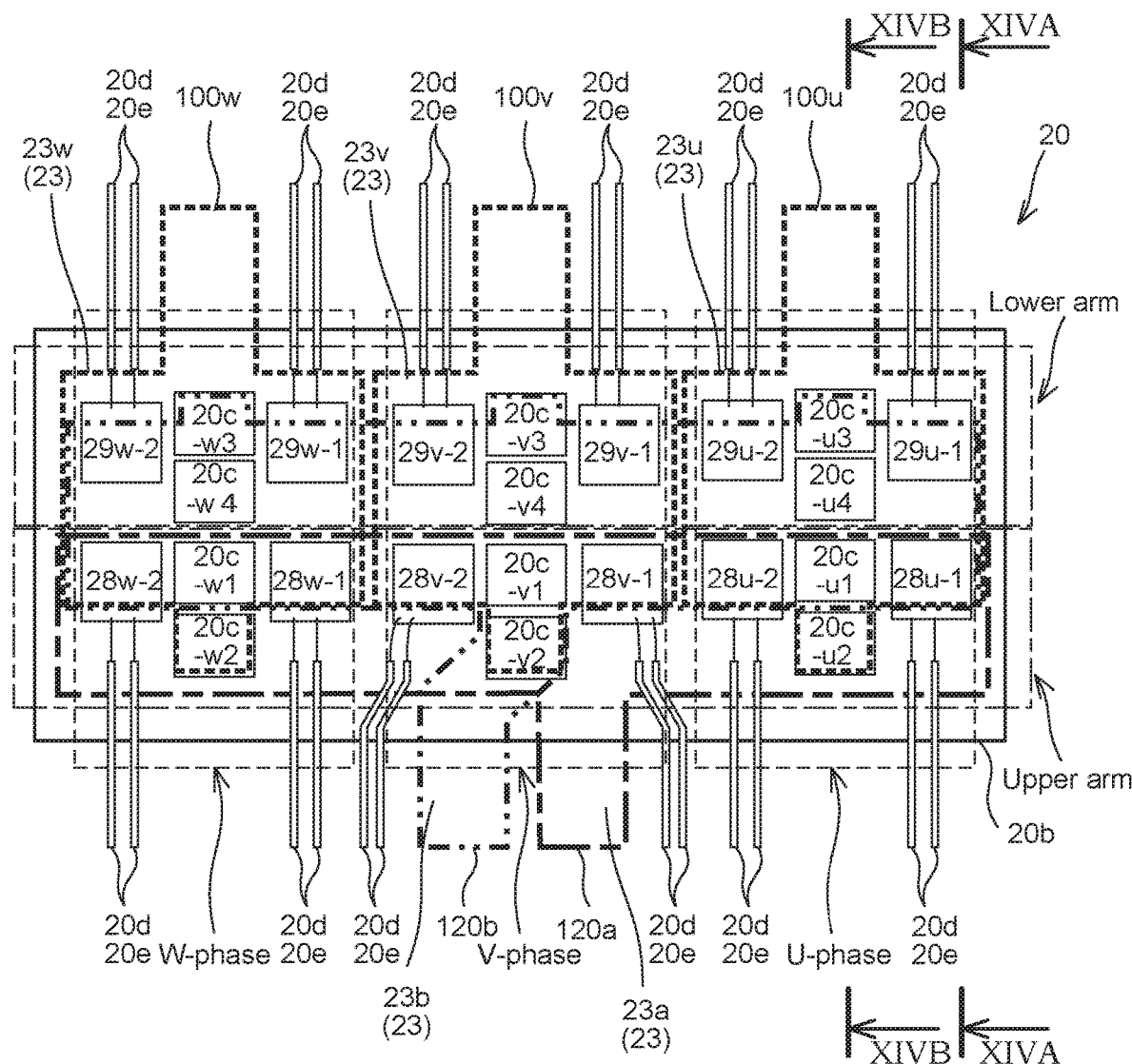
FIG. 8 is a see-through top view of the power module.

In FIG. 8, the U-phase, the V-phase, and the W-phase are each formed of the upper arm, which consists of two switching devices and two diodes, and the lower arm, which consists of two switching devices and two diodes. All of these switching devices and diodes are arranged in a flat plane in the power module 20.

As shown in FIG. 8, the upper arm (positive electrode side) of the U-phase is formed of two switching devices 28u-1 and 28u-2 and two diodes 20c-u1 and 20c-u2. The lower arm (negative electrode side) of the U-phase is formed of two switching devices 29u-1 and 29u-2 and two diodes 20c-u3 and 20c-u4.

The switching devices 29u-1 and 29u-2 are arranged side by side in the length-wise direction of the resin molded portion 20b. The diodes 20c-u3 and 20c-u4 are arranged between the two switching devices 29*u*-1 and 29*u*-2 and are arranged side by side in the width-wise direction of the resin molded portion 20*b*.

Similarly, the switching devices 28*u*-1 and 28*u*-2 are arranged side by side in the length-wise direction of the resin molded portion 20*b*. The diodes 20*c*-*u*1 and 20*c*-*u*2 are arranged between the two switching devices 28*u*-1 and 28*u*-2 and are arranged side by side in the width-wise direction of the resin molded portion 20*b*.

The U-phase bus bar 23*u* includes a terminal portion 100*u* serving as an alternating-current terminal that projects out from the side surface of the resin molded portion 20*b*. On the U-phase bus bar 23*u*, the two switching devices 29*u*-1 and 29*u*-2 and the two diodes 20*c*-*u*3 and 20*c*-*u*4 are mounted (see FIGS. 14A and 14B). The switching devices 29*u*-1 and 29*u*-2 and the diodes 20*c*-*u*3 and 20*c*-*u*4 are interposed between the U-phase bus bar 23*u* and the negative-electrode bus bar 23*b*. In other words, the collector sides of the switching devices 29*u*-1 and 29*u*-2 are connected to the U-phase bus bar 23*u*, and the emitter sides of the switching devices 29*u*-1 and 29*u*-2 are connected to the negative-electrode bus bar 23*b*. The switching devices 29*u*-1 and 29*u*-2 having such a configuration perform switching of conduction of electric power between the U-phase bus bar 23*u* and the negative-electrode bus bar 23*b* as the switching device 29*u* of the lower arm of the U-phase.

The terminal portion 100*u* of the U-phase bus bar 23*u* projects out in the outward direction of the resin molded portion 20*b* from the position where the diodes 20*c*-*u*3 and 20*c*-*u*4 are arranged between the two switching devices 29*u*-1 and 29*u*-2.

The signal lines 20*d* and 20*e* are respectively connected to the switching devices 29*u*-1 and 29*u*-2 by bonding wires etc. The signal lines 20*d* and 20*e* project out in the outward direction of the resin molded portion 20*b* from the positions adjacent to the terminal portion 100*u* of the U-phase bus bar 23*u* on both sides thereof in the length-wise direction.

Figure 14A:
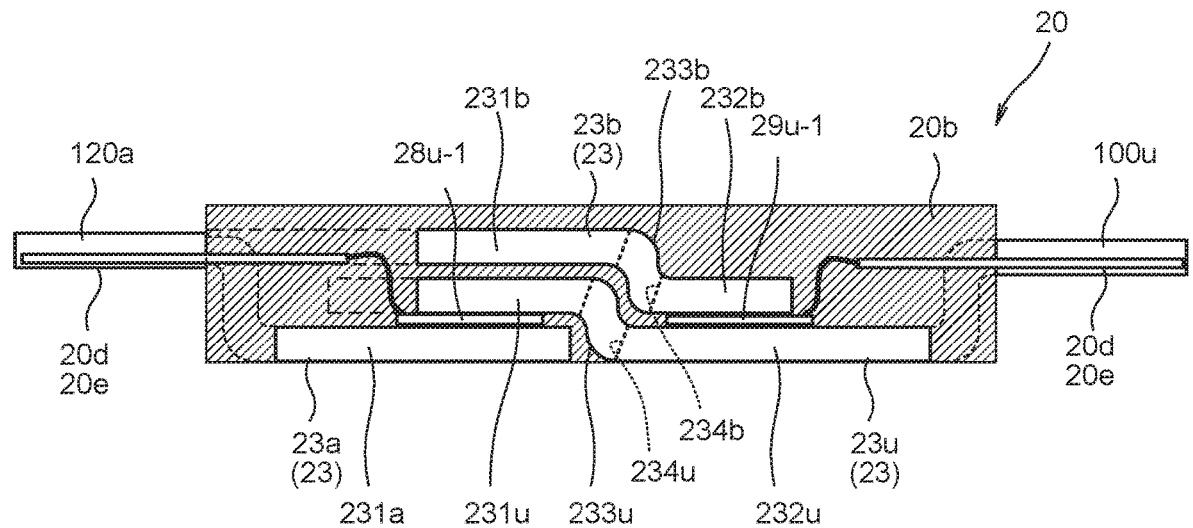
FIG. 14A is a XIVA-XIVA sectional view in FIG. 8.
Figure 14B:
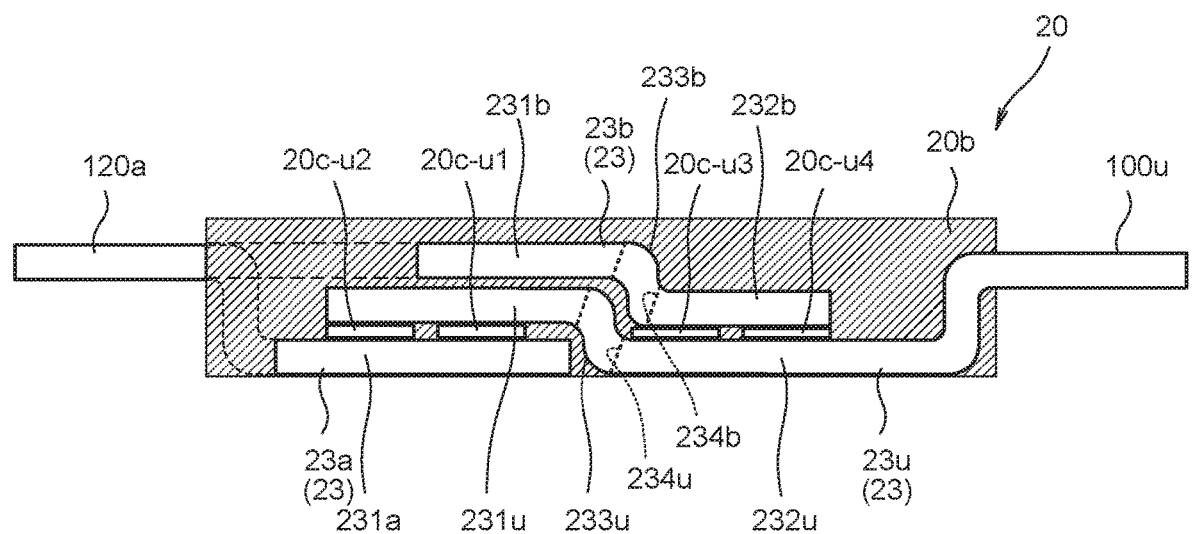
FIG. 14B is a XIVB-XIVB sectional view in FIG. 8.

In the U-phase, the two switching devices 28*u*-1 and 28*u*-2 are arranged in the length-wise direction, and the two diodes 20*c*-*u*1 and 20*c*-*u*2 are arranged in the width-wise direction, and thereby, each of them is mounted on the positive-electrode bus bar 23*a* (see FIGS. 14A and 14B). The switching devices 28*u*-1 and 28*u*-2 and the diodes 20*c*-*u*1 and 20*c*-*u*2 are interposed between the positive-electrode bus bar 23*a* and the U-phase bus bar 23*u*. In other words, the collector sides of the switching devices 28*u*-1 and 28*u*-2 are connected to the positive-electrode bus bar 23*a*, and the emitter sides of the switching devices 28*u*-1 and 28*u*-2 are connected to the U-phase bus bar 23*u*. The switching devices 28*u*-1 and 28*u*-2 having such a configuration perform switching of conduction of electric power between the positive-electrode bus bar 23*a* and the U-phase bus bar 23*u* as the switching device 28*u* of the upper arm of the U-phase.

The signal lines 20*d* and 20*e* are respectively connected to the switching devices 28*u*-1 and 28*u*-2. The signal lines 20*d* and 20*e* project out in the outward direction of the resin molded portion 20*b* from the surface at the opposite side from the surface on which the terminal portion 100*u* of the U-phase bus bar 23*u* is provided so as to project out therefrom.

The upper arm (positive electrode side) of the V-phase is formed of two switching devices 28*v*-1 and 28*v*-2 and two diodes 20*c*-*v*1 and 20*c*-*v*2. The lower arm (negative electrode side) of the V-phase is formed of two switching devices 29*v*-1 and 29*v*-2 and two diodes 20*c*-*v*3 and 20*c*-*v*4.

The switching devices 29*v*-1 and 29*v*-2 are arranged side by side in the length-wise direction of the resin molded portion 20*b*. The diodes 20*c*-*v*3 and 20*c*-*v*4 are arranged between the two switching devices 29*v*-1 and 29*v*-2 and are arranged side by side as a pair in the width-wise direction of the resin molded portion 20*b*.

Similarly, the switching devices 28*v*-1 and 28*v*-2 are arranged side by side in the length-wise direction of the resin molded portion 20*b*. The diodes 20*c*-*v*1 and 20*c*-*v*2 are arranged between the two switching devices 28*v*-1 and 28*v*-2 and are arranged side by side in the width-wise direction of the resin molded portion 20*b*.

The V-phase bus bar 23*v* includes a terminal portion 100*v* serving as the alternating-current terminal that projects out from the side surface of the resin molded portion 20*b*. On the V-phase bus bar 23*v*, the two switching devices 29*v*-1 and 29*v*-2 and the two diodes 20*c*-*v*3 and 20*c*-*v*4 are mounted. The switching devices 29*v*-1 and 29*v*-2 and the diodes 20*c*-*v*3 and 20*c*-*v*4 are interposed between the V-phase bus bar 23*v* and the negative-electrode bus bar 23*b*. In other words, the collector sides of the switching devices 29*v*-1 and 29*v*-2 are connected to the V-phase bus bar 23*v*, and the emitter sides of the switching devices 29*v*-1 and 29*v*-2 are connected to the negative-electrode bus bar 23*b*. The switching devices 29*v*-1 and 29*v*-2 having such a configuration perform switching of conduction of electric power between the V-phase bus bar 23*v* and the negative-electrode bus bar 23*b* as the switching device 29*v* of the lower arm of the V-phase.

The terminal portion 100*v* of the V-phase bus bar 23*v* projects out in the outward direction of the resin molded portion 20*b* from the position where the diodes 20*c*-*v*3 and 20*c*-*v*4 are arranged between the two switching devices 29*v*-1 and 29*v*-2.

The signal lines 20*d* and 20*e* are respectively connected to the switching devices 29*v*-1 and 29*v*-2. The signal lines 20*d* and 20*e* project out in the outward direction of the resin molded portion 20*b* from the positions adjacent to the terminal portion 100*v* of the V-phase bus bar 23*v* on both sides thereof in the length-wise direction.

In the V-phase, the two switching devices 28*v*-1 and 28*v*-2 are arranged in the length-wise direction, and the two diodes 20*c*-*v*1 and 20*c*-*v*2 are arranged in the width-wise direction, and thereby, each of them is mounted on the positive-electrode bus bar 23*a*. The switching devices 28*v*-1 and 28*v*-2 and the diodes 20*c*-*v*1 and 20*c*-*v*2 are interposed between the positive-electrode bus bar 23*a* and the V-phase bus bar 23*v*. In other words, the collector sides of the switching devices 28*v*-1 and 28*v*-2 are connected to the positive-electrode bus bar 23*a*, and the emitter sides of the switching devices 28*v*-1 and 28*v*-2 are connected to the V-phase bus bar 23*v*. The switching devices 28*v*-1 and 28*v*-2 having such a configuration perform switching of conduction of electric power between the positive-electrode bus bar 23*a* and the V-phase bus bar 23*v* as the switching device 28*v* of the upper arm of the V-phase.

The signal lines 20*d* and 20*e* are respectively connected to the switching devices 28*v*-1 and 28*v*-2. The signal lines 20*d* and 20*e* project out in the outward direction of the resin molded portion 20*b* from the surface at the opposite side from the surface on which the terminal portion 100*v* of the V-phase bus bar 23*v* is provided so as to project out therefrom.

In the vicinities of the positions where the switching devices 28*v*-1 and 28*v*-2 are arranged, a terminal portion 120*a* serving as a positive direct-current terminal of the positive-electrode bus bar 23*a* and a terminal portion 120*b* serving as a negative direct-current terminal of the negative-electrode bus bar 23b project out in the outward direction of the resin molded portion 20b. The signal lines 20d and 20e that are connected to the switching devices 28v-1 and 28v-2 are connected such that they are offset in the length-wise direction of the resin molded portion 20b so as to avoid the terminal portion 120a of the positive-electrode bus bar 23a and the terminal portion 120b of the negative-electrode bus bar 23b.

The upper arm (positive electrode side) of the W-phase is formed of two switching devices 28w-1 and 28w-2 and two diodes 20c-w1 and 20c-w2. The lower arm (negative electrode side) of the W-phase is formed of two switching devices 29w-1 and 29w-2 and two diodes 20c-w3 and 20c-w4.

The switching devices 29w-1 and 29w-2 are arranged side by side in the length-wise direction of the resin molded portion 20b. The diodes 20c-w3 and 20c-w4 are arranged between the two switching devices 29w-1 and 29w-2 and are arranged side by side as a pair in the width-wise direction of the resin molded portion 20b.

Similarly, the switching devices 28w-1 and 28w-2 are arranged side by side as a pair in the length-wise direction of the resin molded portion 20b. The diodes 20c-w1 and 20c-w2 are arranged between the two switching devices 28w-1 and 28w-2 and are arranged side by side as a pair in the width-wise direction of the resin molded portion 20b.

The W-phase bus bar 23w includes a terminal portion 100w serving as the alternating-current terminal that projects out from the side surface of the resin molded portion 20b. On the W-phase bus bar 23w, the two switching devices 29w-1 and 29w-2 and the two diodes 20c-w3 and 20c-w4 are mounted. The switching devices 29w-1 and 29w-2 and the diodes 20c-w3 and 20c-w4 are interposed between the W-phase bus bar 23w and the negative-electrode bus bar 23b. In other words, the collector sides of the switching devices 29w-1 and 29w-2 are connected to the W-phase bus bar 23w, and the emitter sides of the switching devices 29w-1 and 29w-2 are connected to the negative-electrode bus bar 23b. The switching devices 29w-1 and 29w-2 having such a configuration perform switching of conduction of electric power between the W-phase bus bar 23w and the negative-electrode bus bar 23b as the switching device 29w of the lower arm of the W-phase.

The terminal portion 100w of the W-phase bus bar 23w projects out in the outward direction of the resin molded portion 20b from the position where the diodes 20c-w3 and 20c-w4 are arranged between the two switching devices 29w-1 and 29w-2.

The signal lines 20d and 20e are respectively connected to the switching devices 29w-1 and 29w-2. The signal lines 20d and 20e project out in the outward direction of the resin molded portion 20b from the positions adjacent to the terminal portion 100w of the W-phase bus bar 23w on both sides thereof in the length-wise direction.

In the W-phase, the two switching devices 28w-1 and 28w-2 are arranged in the length-wise direction, and the two diodes 20c-w1 and 20c-w2 are arranged in the width-wise direction, and thereby, each of them is mounted on the positive-electrode bus bar 23a. The switching devices 28w-1 and 28w-2 and the diodes 20c-w1 and 20c-w2 are interposed between the positive-electrode bus bar 23a and the W-phase bus bar 23w. In other words, the collector sides of the switching devices 28w-1 and 28w-2 are connected to the positive-electrode bus bar 23a, and the emitter sides of the switching devices 28w-1 and 28w-2 are connected to the W-phase bus bar 23w. The switching devices 28w-1 and 28w-2 having such a configuration perform switching of conduction of electric power between the positive-electrode bus bar 23a and the W-phase bus bar 23w as the switching device 28w of the upper arm of the W-phase.

The signal lines 20d and 20e are respectively connected to the switching devices 28w-1 and 28w-2. The signal lines 20d and 20e project out in the outward direction of the resin molded portion 20b from the surface at the opposite side from the surface on which the terminal portion 100w of the W-phase bus bar 23w is provided so as to project out therefrom.

Figure 9A:
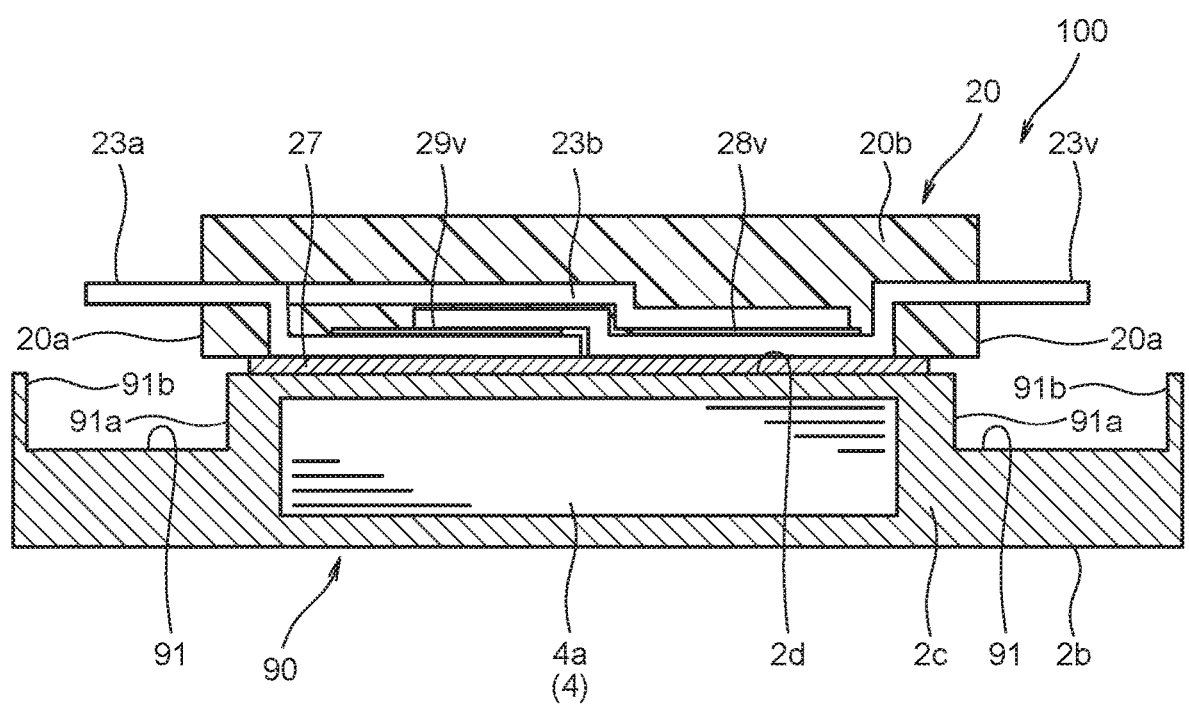
FIG. 9A is a sectional view of the semiconductor component according to a first embodiment of the present invention, and is a diagram showing a cross section taken along the line IXA-IXA in FIG. 4.
Figure 9B:
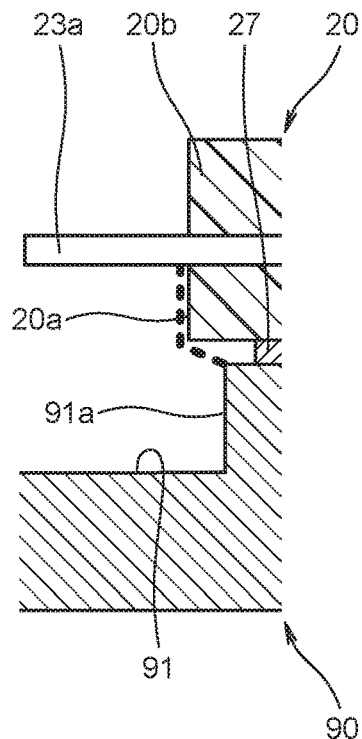
FIG. 9B is a diagram showing a clearance distance between the cooler and a terminal in the semiconductor component shown in FIG. 9A.
Figure 9C:
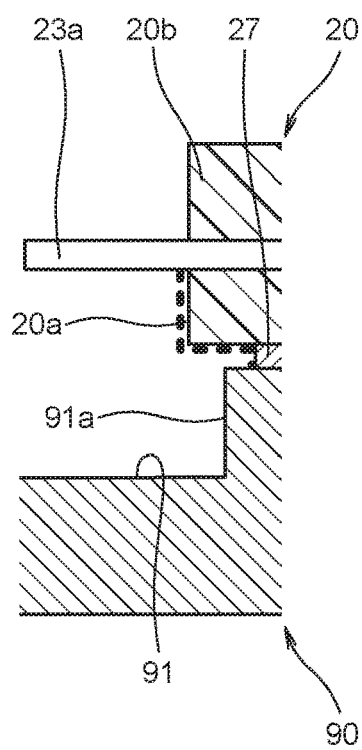
FIG. 9C is a diagram showing a creepage distance between the cooler and the terminal in the semiconductor component shown in FIG. 9A.

As shown in FIG. 9A, the positive-electrode bus bar 23a, the U-phase bus bar 23u, the V-phase bus bar 23v, and the W-phase bus bar 23w are not completely encapsulated in the resin molded portion 20b such that surfaces of the parts thereof are exposed at a bottom portion of the resin molded portion 20b.

The power module 20 is mounted on the cooler 90 such that an insulation sheet 27 is provided therebetween. The insulation sheet 27 is brought into contact with the positive-electrode bus bar 23a, the U-phase bus bar 23u, the V-phase bus bar 23v, and the W-phase bus bar 23w that are exposed from the resin molded portion 20b. The insulation sheet 27 is formed of non-conductive materials, such as ceramics, resins, and so forth. By providing the insulation sheet 27, even when the positive-electrode bus bar 23a, the U-phase bus bar 23u, the V-phase bus bar 23v, and the W-phase bus bar 23w are not completely encapsulated in the resin molded portion 20b, it is possible to ensure insulation against the cooler 90. Note that, the cooler 90 is formed of metallic materials (conductive materials) such as aluminum, etc.

The positive-electrode bus bar 23a is connected to a positive electrode of the battery 5. The negative-electrode bus bar 23b is connected to a negative electrode of the battery 5. The positive-electrode bus bar 23a and the negative-electrode bus bar 23b are connected to the capacitor module 10 in parallel. The U-phase bus bar 23u, the V-phase bus bar 23v, and the W-phase bus bar 23w are connected to the U-phase, the V-phase, and the W-phase of the motor generator 6, respectively, via the output bus bars 24.

As shown in FIG. 5, the IGBTs 28u to 29w respectively have the diodes 20c that serve as freewheeling diodes connected in parallel in a reversed direction. The IGBTs 28u to 29w are respectively provided with the signal line (gate signal lead) 20d for performing the switching control and the signal line (emitter signal lead) 20e for detecting a reference voltage on the emitter side.

The IGBT 28u and the IGBT 29u are provided between the positive-electrode bus bar 23a and the negative-electrode bus bar 23b, and thereby, the IGBT 28u and the IGBT 29u are connected with the U-phase bus bar 23u in series such that the U-phase bus bar 23u is sandwiched therebetween. The U-phase bus bar 23u is connected via the output bus bars 24 to a coil (not shown) that forms the U-phase of the motor generator 6. The IGBT 28v and the IGBT 29v are provided between the positive-electrode bus bar 23a and the negative-electrode bus bar 23b, and thereby, the IGBT 28v and the IGBT 29v are connected with the V-phase bus bar 23v in series such that the V-phase bus bar 23v is sandwiched therebetween. The V-phase bus bar 23v is connected via the output bus bars 24 to a coil (not shown) that forms the V-phase of the motor generator 6. The IGBT 28w and the IGBT 28w are provided between the positive-electrode bus bar 23a and the negative-electrode bus bar 23b, and thereby, the IGBT 28w and the IGBT 28w are connected with the W-phase bus bar 23w in series such that the W-phase bus bar 23w is sandwiched therebetween. The W-phase bus bar 23w is connected via the output bus bars 24 to a coil (not shown) that forms the W-phase of the motor generator 6.

As the IGBTs 28u to 29w are subjected to the switching control performed by the driver substrate 21, the power module 20 generates alternating current and drives the motor generator 6. As the IGBTs 28u to 29w are subjected to the switching control performed by the driver substrate 21, the power module 20 converts regenerative electric power from the motor generator 6 from alternating current to direct current and allows the battery 5 to be charged.

As shown in FIG. 9A, the cooler 90 cools the IGBTs 28u to 29w through the bottom portion of the resin molded portion 20b. The cooler 90 has the power module cooling portion 4a that is a part of the coolant-water flow channel 4 provided in the bottom case 2b such that the coolant water flows therethrough. The power module 20 is cooled by a heat exchange with the coolant water flowing in the power module cooling portion 4a.

Note that, the IGBTs 28u to 29w are arranged such that the surfaces forming the collector face the cooler 90. With such a configuration, the IGBTs 28u to 29w can be cooled through the collector side.

As shown in FIG. 4, the cooler 90 has the power module cooling portion (first cooling medium flow channel) 4a through which the coolant water flows to cool the power module 20 and the DC/DC converter cooling portion (second cooling medium flow channel) 4b through which the coolant water flows to cool the DC/DC converter 30 provided as a separate device from the power module 20. The cooler 90 has a pair of recessed portions 91 at positions facing the positive-electrode bus bar 23a, the negative-electrode bus bar 23b, the U-phase bus bar 23u, the V-phase bus bar 23v, and the W-phase bus bar 23w. The recessed portions 91 are formed to have shapes recessed from the surface on which the power module 20 is mounted.

As shown in FIG. 4, one of the recessed portions 91 that faces the positive-electrode bus bar 23a and the negative-electrode bus bar 23b is formed between the power module cooling portion 4a and the DC/DC converter cooling portion 4b so as to have a grooved shape. The other of the recessed portions 91 that faces the U-phase bus bar 23u, the V-phase bus bar 23v, and the W-phase bus bar 23w is formed between the power module cooling portion 4a and the output bus bars 24 so as to have the grooved shape. Thus, because the recessed portions 91 are formed in portions where the coolant-water flow channel 4 is not provided, it is possible to effectively utilize a space in the bottom portion 2c and to prevent the thickness of the bottom portion 2c from being increased as compared with the case in which the recessed portions 91 is formed above the coolant-water flow channel 4.

As shown in FIG. 9A, inner end portions 91a of the recessed portions 91 are formed so as to be positioned at the inner side of end portions 20a of the resin molded portion 20b. In addition, outer end portions 91b of the recessed portions 91 are formed so as to be positioned at the outer side of tip ends of the positive-electrode bus bar 23a, the negative-electrode bus bar 23b, the U-phase bus bar 23u, the V-phase bus bar 23v, and the W-phase bus bar 23w. In other words, the recessed portions 91 are formed so as to extend from the position facing the positive-electrode bus bar 23a, the negative-electrode bus bar 23b, the U-phase bus bar 23u, the V-phase bus bar 23v, and the W-phase bus bar 23w to the position at the inner side of the end portions 20a of the resin molded portion 20b.

As described above, by providing the recessed portions 91, as compared with the case in which the recessed portions 91 are not provided, the clearance distance and the creepage distance (the distance shown with the broken line in FIG. 9C) between the cooler 90 and each of the positive-electrode bus bar 23a, the negative-electrode bus bar 23b, the U-phase bus bar 23u, the V-phase bus bar 23v, and the W-phase bus bar 23w are increased. Therefore, it is possible to secure the clearance distance (the distance shown with the broken line in FIG. 9B) between the cooler 90 and each of the positive-electrode bus bar 23a, the negative-electrode bus bar 23b, the U-phase bus bar 23u, the V-phase bus bar 23v, and the W-phase bus bar 23w, and so, it is possible to improve the electric insulation property.

With such a configuration, as described in the above-mentioned embodiment, it is possible to reduce the thickness of the power module 20, and even when the resin molded portion 20b is molded by the transfer molding and even when the positive-electrode bus bar 23a, the negative-electrode bus bar 23b, the U-phase bus bar 23u, the V-phase bus bar 23v, and the W-phase bus bar 23w project out towards the side of the resin molded portion 20b, it is possible to ensure the electric insulation property.

According to the first embodiment mentioned above, the advantages described below are afforded.

The cooler 90 that cools the IGBTs 28u to 29w through the bottom portion of the resin molded portion 20b has the recessed portions 91 that extend from the positions facing the positive-electrode bus bar 23a, the negative-electrode bus bar 23b, the U-phase bus bar 23u, the V-phase bus bar 23v, and the W-phase bus bar 23w to the positions at the inner side of the end portions 20a of the resin molded portion 20b. By providing the recessed portions 91, as compared with the case in which the recessed portions 91 are not provided, the clearance distance and the creepage distance between the cooler 90 and each of the positive-electrode bus bar 23a, the negative-electrode bus bar 23b, the U-phase bus bar 23u, the V-phase bus bar 23v, and the W-phase bus bar 23w are increased. Therefore, it is possible to secure the clearance distance between the cooler 90 and each of the positive-electrode bus bar 23a, the negative-electrode bus bar 23b, the U-phase bus bar 23u, the V-phase bus bar 23v, and the W-phase bus bar 23w, and so, it is possible to improve the electric insulation property.

Second Embodiment

In the following, the semiconductor component 200 according to a second embodiment of the present invention will be described with reference to FIGS. 10A to 11C. In each of the embodiments shown below, differences from the first embodiment will be mainly described, and components that have similar functions are assigned the same reference numerals and descriptions thereof will be omitted.

In the semiconductor component 200, a resin molded portion 220b has a different shape from that of the resin molded portion 20b in the first embodiment.

Figure 10A:
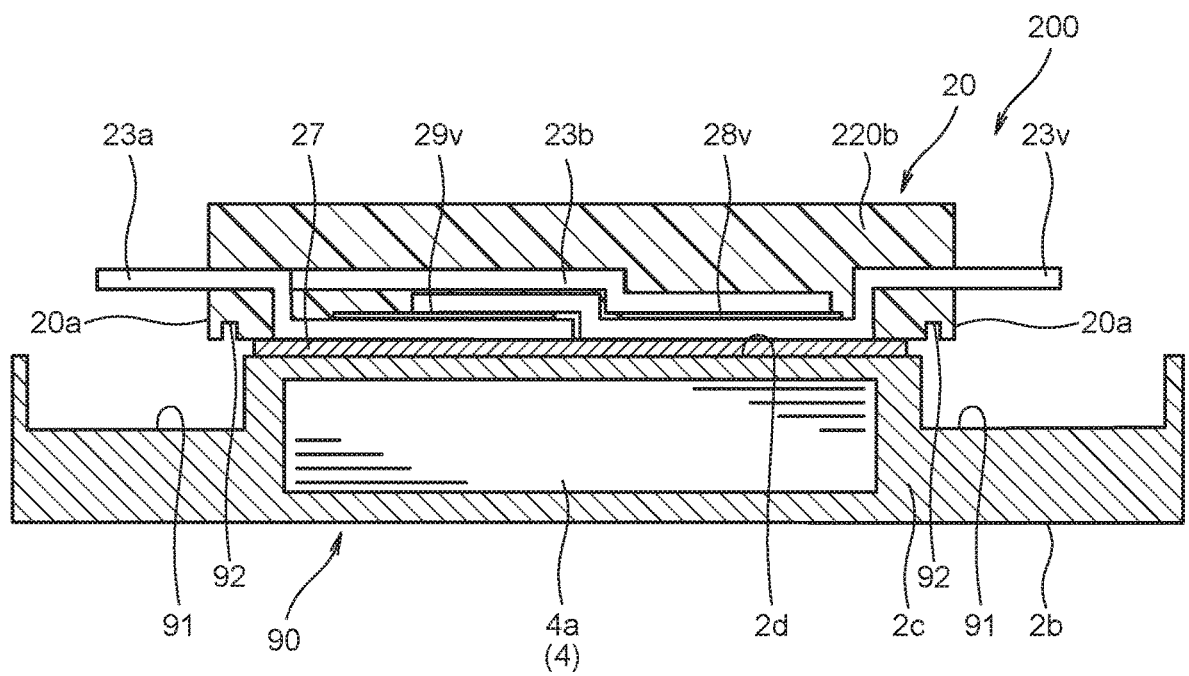
FIG. 10A is a sectional view of the semiconductor component according to a second embodiment of the present invention.
Figure 10B:
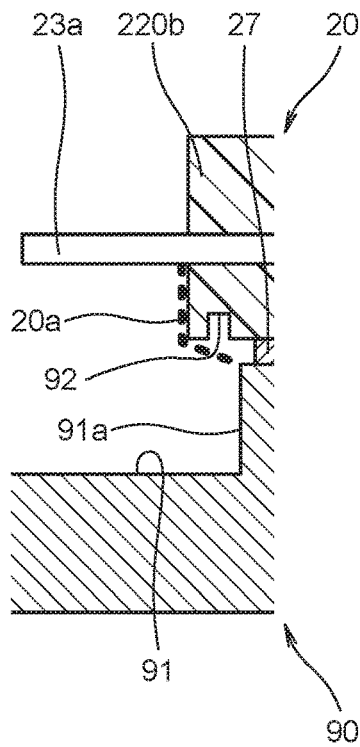
FIG. 10B is a diagram showing the clearance distance between the cooler and the terminal in the semiconductor component shown in FIG. 10A.
Figure 10C:
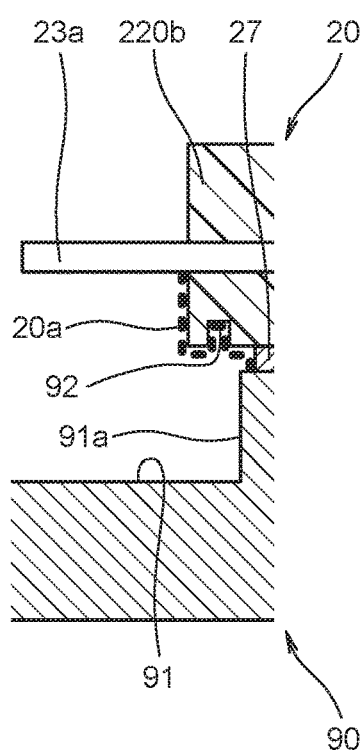
FIG. 10C is a diagram showing the creepage distance between the cooler and the terminal in the semiconductor component shown in FIG. 10A.

As shown in FIG. 10A, the resin molded portion 220b further has a pair of recessed portions 92 that are formed to have shapes recessed from a surface facing the recessed portions 91 of the cooler 90. The recessed portions 92 are formed to have grooved shapes so as to respectively face the recessed portions 91 of the cooler 90.

With such a configuration, the creepage distance (the distance shown with the broken line in FIG. 10C) between the cooler 90 and each of the positive-electrode bus bar 23a, the negative-electrode bus bar 23b, the U-phase bus bar 23u, the V-phase bus bar 23v, and the W-phase bus bar 23w is further increased. Therefore, it is possible to secure the clearance distance (the distance shown with the broken line in FIG. 10B) between the cooler 90 and each of the positive-electrode bus bar 23a, the negative-electrode bus bar 23b, the U-phase bus bar 23u, the V-phase bus bar 23v, and the W-phase bus bar 23w, and so, it is possible to improve the electric insulation property.

Figure 11A:
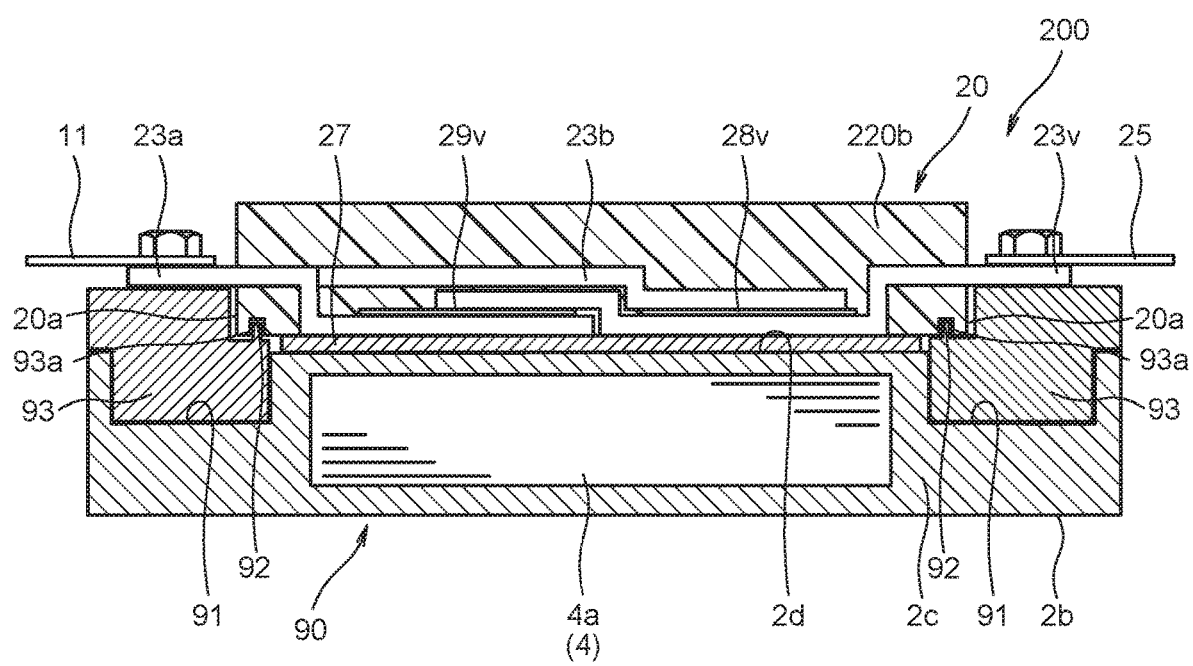
FIG. 11A is a sectional view of the semiconductor component according to a modification of the second embodiment of the present invention.
Figure 11B:
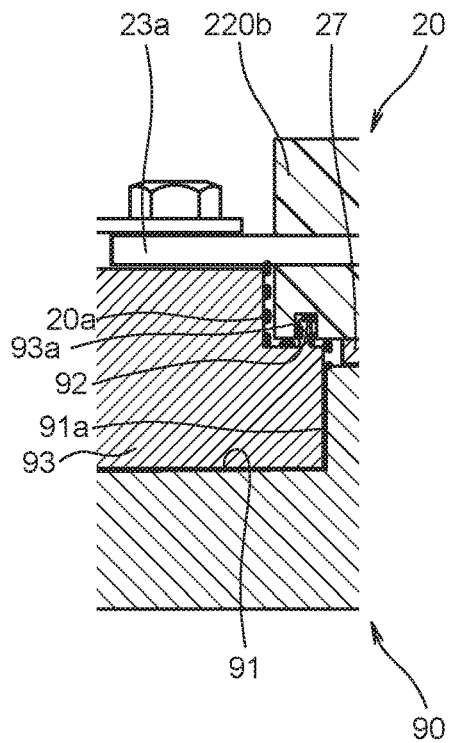
FIG. 11B is a diagram showing the clearance distance between the cooler and the terminal in the semiconductor component shown in FIG. 11A.
Figure 11C:
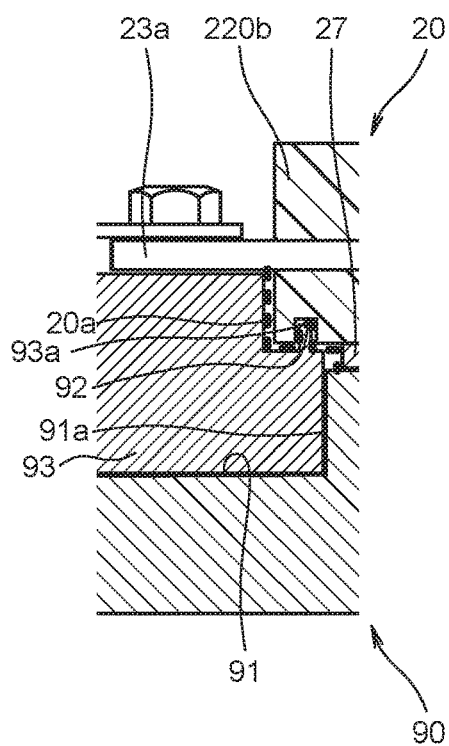
FIG. 11C is a diagram showing the creepage distance between the cooler and the terminal in the semiconductor component shown in FIG. 11A.

Note that, as shown in FIG. 11A, terminal bases 93 may be respectively provided in the recessed portions 91 of the cooler 90. The terminal bases 93 are provided between the recessed portions 91 and the positive-electrode bus bar 23a, the negative-electrode bus bar 23b, the U-phase bus bar 23u, the V-phase bus bar 23v, and the W-phase bus bar 23w so as to support the positive-electrode bus bar 23a, the negative-electrode bus bar 23b, the U-phase bus bar 23u, the V-phase bus bar 23v, and the W-phase bus bar 23w. The positive-electrode bus bar 23a and the negative-electrode bus bar 23b are fastened to the first bus bars 11 by bolts at a top surface of the terminal bases 93. The U-phase bus bar 23u, the V-phase bus bar 23v, and the W-phase bus bar 23w are respectively fastened to the power module terminals 25 of the output bus bars 24 by bolts at the top surface of the terminal bases 93.

The terminal bases 93 each have a protruded portion 93a that is to be inserted into the recessed portion 92 of the resin molded portion 220b. By providing the terminal bases 93, the protruded portions 93a are respectively inserted into the recessed portions 92, and the clearance distance (the distance shown with the broken line in FIG. 11B) between the cooler 90 and each of the positive-electrode bus bar 23a, the negative-electrode bus bar 23b, the U-phase bus bar 23u, the V-phase bus bar 23v, and the W-phase bus bar 23w is further increased.

According to the second embodiment described above, the similar effects as those of the first embodiment are afforded, and the clearance distance and the creepage distance between the cooler 90 and each of the positive-electrode bus bar 23a, the negative-electrode bus bar 23b, the U-phase bus bar 23u, the V-phase bus bar 23v, and the W-phase bus bar 23w are further increased. It is thus possible to further improve the electric insulation property between the cooler 90 and each of the positive-electrode bus bar 23a, the negative-electrode bus bar 23b, the U-phase bus bar 23u, the V-phase bus bar 23v, and the W-phase bus bar 23w.

Third Embodiment

The semiconductor component 300 according to a third embodiment of the present invention will be described below with reference to FIGS. 12A to 13C.

In the semiconductor component 300, a resin molded portion 320b has a different shape from those of the resin molded portions 20b and 220b in the first and second embodiments.

Figure 12A:
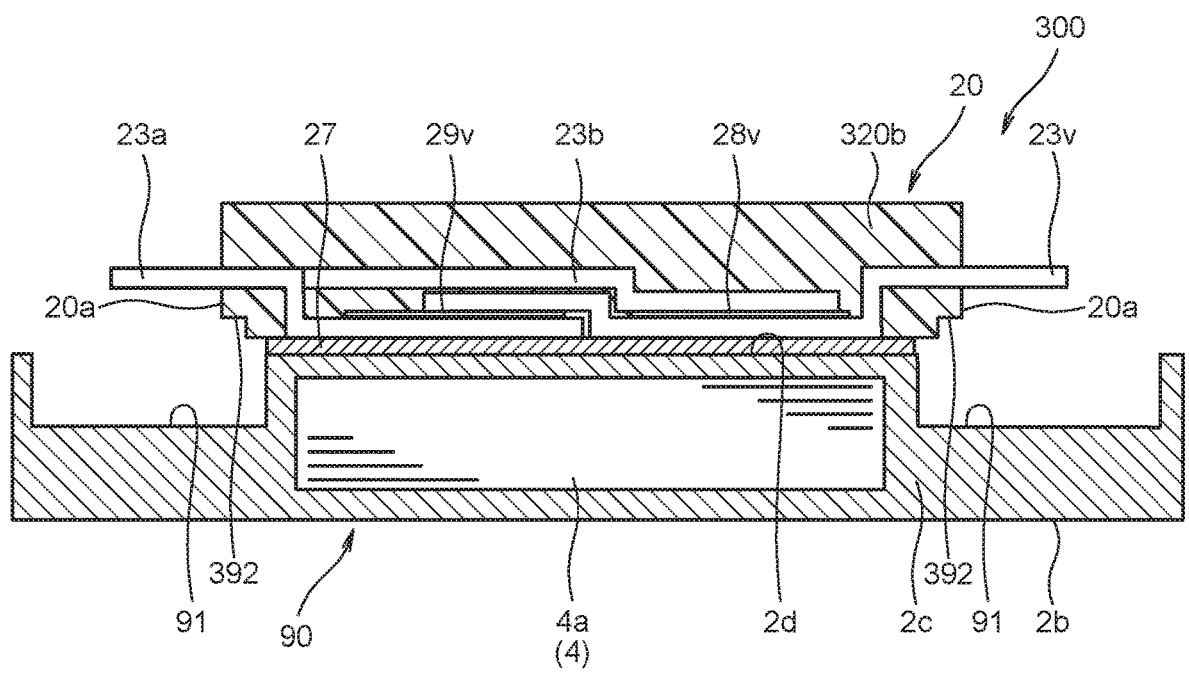
FIG. 12A is a sectional view of the semiconductor component according to a third embodiment of the present invention.
Figure 12B:
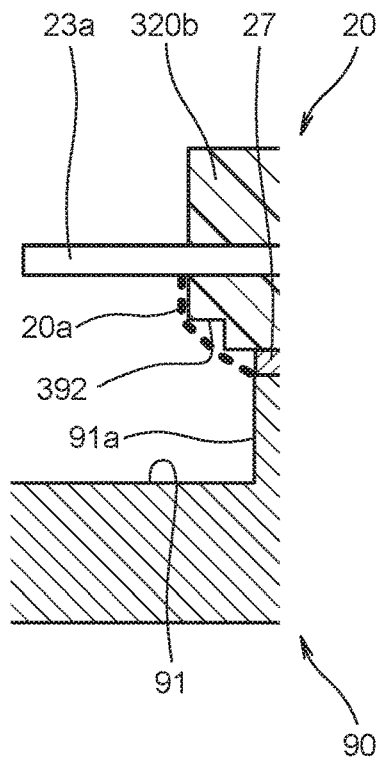
FIG. 12B is a diagram showing the clearance distance between the cooler and the terminal in the semiconductor component shown in FIG. 12A.
Figure 12C:
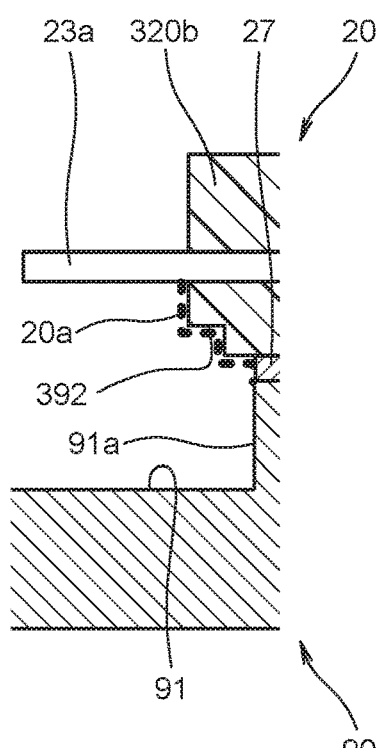
FIG. 12C is a diagram showing the creepage distance between the cooler and the terminal in the semiconductor component shown in FIG. 12A.

As shown in FIG. 12A, the resin molded portion 320b further has a pair of recessed portions 392 that are formed to have shapes recessed from a surface facing the recessed portions 91 of the cooler 90. The recessed portions 92 are formed to have notched shapes on the corners of a bottom surface of the resin molded portion 320b so as to respectively face the recessed portions 91 of the cooler 90.

With such a configuration, the creepage distance (the distance shown with the broken line in FIG. 12C) between the cooler 90 and each of the positive-electrode bus bar 23a, the negative-electrode bus bar 23b, the U-phase bus bar 23u, the V-phase bus bar 23v, and the W-phase bus bar 23w is further increased. Therefore, it is possible to secure the clearance distance (the distance shown with the broken line in FIG. 12B) between the cooler 90 and each of the positive-electrode bus bar 23a, the negative-electrode bus bar 23b, the U-phase bus bar 23u, the V-phase bus bar 23v, and the W-phase bus bar 23w, and so, it is possible to improve the electric insulation property.

Figure 13A:
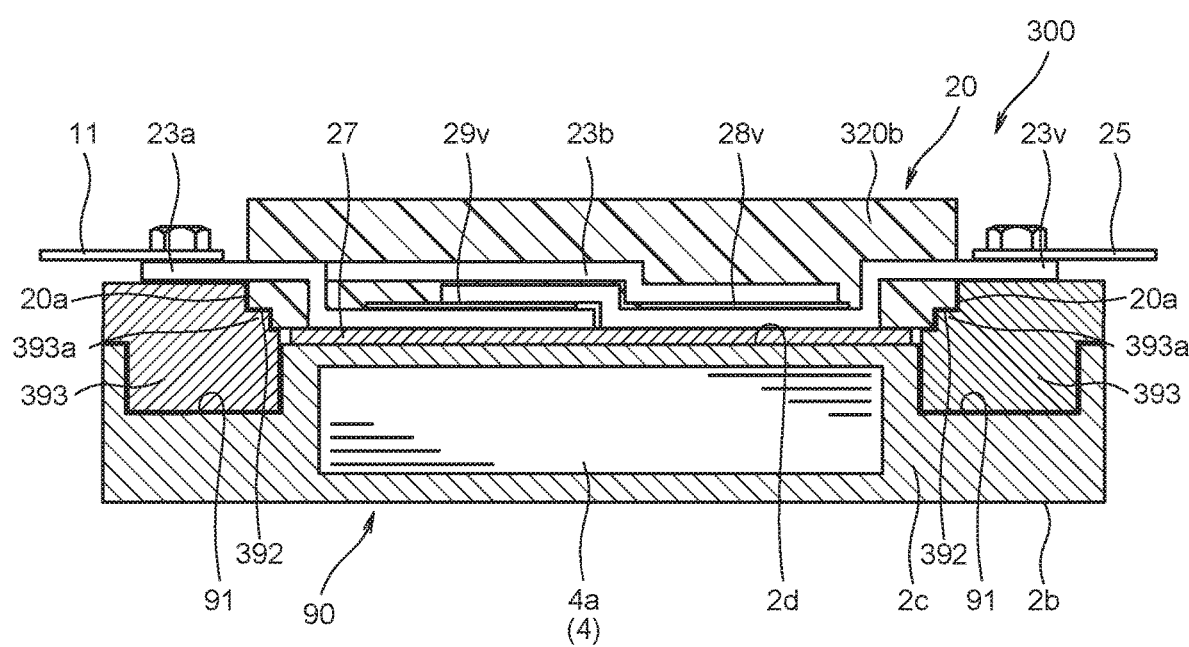
FIG. 13A is a sectional view of the semiconductor component according to a modification of the third embodiment of the present invention.
Figure 13B:
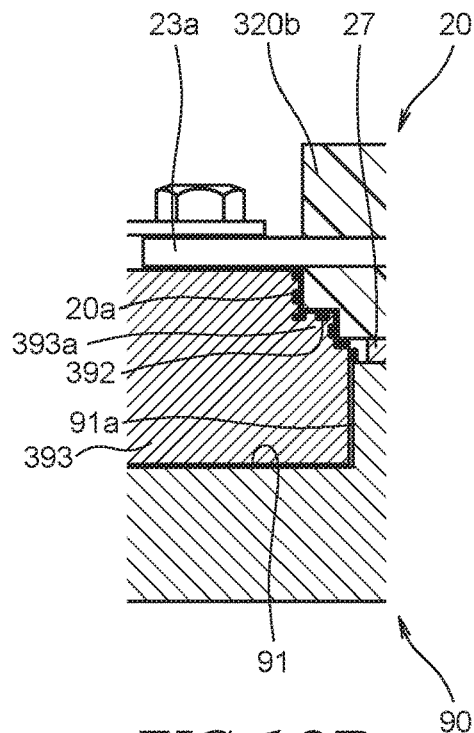
FIG. 13B is a diagram showing the clearance distance between the cooler and the terminal in the semiconductor component shown in FIG. 13A.
Figure 13C:
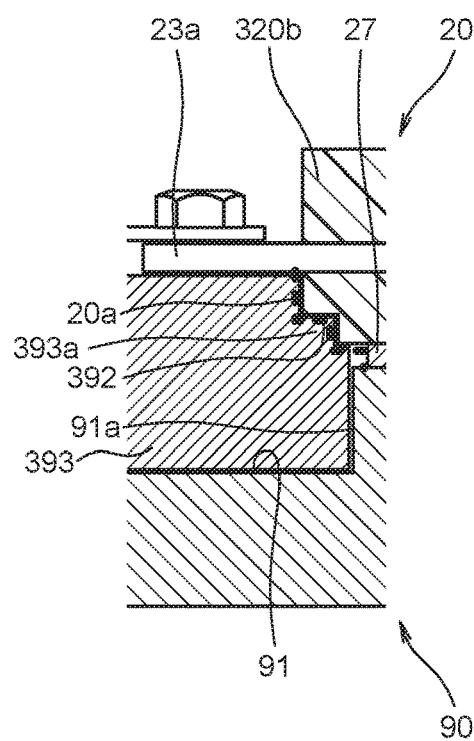
FIG. 13C is a diagram showing the creepage distance between the cooler and the terminal in the semiconductor component shown in FIG. 13A.

Note that, as shown in FIG. 13A, terminal bases 393 may be provided in the recessed portions 91 of the cooler 90. The terminal bases 393 each have a protruded portion 393a that is inserted into the recessed portion 92 of the resin molded portion 220b. By providing the terminal bases 393, the protruded portions 393a are respectively inserted into the recessed portions 92, and the clearance distance (the distance shown with the broken line in FIG. 13B) between the cooler 90 and each of the positive-electrode bus bar 23a, the negative-electrode bus bar 23b, the U-phase bus bar 23u, the V-phase bus bar 23v, and the W-phase bus bar 23w is further increased.

According to the third embodiment described above, the similar effects as those of the first embodiment are afforded, and the clearance distance and the creepage distance between the cooler 90 and each of the positive-electrode bus bar 23a, the negative-electrode bus bar 23b, the U-phase bus bar 23u, the V-phase bus bar 23v, and the W-phase bus bar 23w are further increased. It is thus possible to further improve the electric insulation property between the cooler 90 and each of the positive-electrode bus bar 23a, the negative-electrode bus bar 23b, the U-phase bus bar 23u, the V-phase bus bar 23v, and the W-phase bus bar 23w.

Next, a configuration of the bus bars 23 in the power module 20 will be described with reference to FIGS. 14A to 15.

In FIGS. 14A and 14B, only the U-phase bus bar 23u is illustrated. Although the V-phase bus bar 23v and the W-phase bus bar 23w are not illustrated, both have the similar configuration as that of the U-phase bus bar 23u. In the following, a description has been given of the U-phase bus bar 23u as an example, and descriptions of the V-phase bus bar 23v and the W-phase bus bar 23w are omitted appropriately.

As shown in FIG. 14A, in the upper arm of the U-phase, the switching device 28u-1 (and 28u-2) is sandwiched between the positive-electrode bus bar 23a and the U-phase bus bar 23u and electrically connected to both bus bars. The signal lines 20d and 20e are connected to the switching device 28u-1 via the bonding wires. In the lower arm of the U-phase, the switching device 29u-1 (and 29u-2) is sandwiched between the negative-electrode bus bar 23b and the U-phase bus bar 23u and electrically connected to both bus bars. The signal lines 20d and 20e are connected to the switching device 29u-1 via the bonding wires.

As shown in FIG. 14B, in the upper arm of the U-phase, the diodes 20c-u1 and 20c-u2 are sandwiched between the positive-electrode bus bar 23a and the U-phase bus bar 23u and electrically connected to both bus bars. In the lower arm of the U-phase, the diodes 20c-u3 and 20c-u4 are sandwiched between the negative-electrode bus bar 23b and the U-phase bus bar 23u and electrically connected to both bus bars.

As shown in FIGS. 14a and 14b, because each of the switching devices and the diodes has a thin shape, and they are sandwiched between the bus bars by being respectively arranged on the flat surface, it is possible to form the power module 20 to have a thin shape.

The positive-electrode bus bar 23a and the U-phase bus bar 23u are arranged such that their flat surfaces face each other. Similarly, the negative-electrode bus bar 23b and the U-phase bus bar 23u are arranged such that their flat surfaces face each other. In other words, the positive-electrode bus bar 23a, the negative-electrode bus bar 23b, and the U-phase bus bar 23u are layered such that their flat surfaces face each other.

Instead of this configuration, for example, the bus bars may be arranged such that only the positive-electrode bus bar 23a and the U-phase bus bar 23u face each other. As described above, in the power module 20, at least two of a plurality of bus bars 23 are arranged so as to face each other.

The U-phase bus bar 23u has a bent portion 233u at which the U-phase bus bar 23u is bent from a first portion 231u facing a top surface of the positive-electrode bus bar 23a to a second portion 232u positioned at the same height as the positive-electrode bus bar 23a. Similarly, the negative-electrode bus bar 23b has a bent portion 233b at which the negative-electrode bus bar 23b is bent from a first portion 231b facing a top surface of the first portion 231u of the U-phase bus bar 23u to a second portion 232b positioned at the same height as the first portion 231u of the U-phase bus bar 23u. In addition, the positive-electrode bus bar 23a has a first portion 231a positioned at the same height as the second portion 232u of the U-phase bus bar 23u.

In this configuration, the second portion 232u of the U-phase bus bar 23u corresponds to a first bonded portion to which the switching devices (first switching devices) 29u-1 and 29u-2 and the diodes (first rectifying devices) 20c-u3 and 20c-u4 are bonded. The first portion 231a of the positive-electrode bus bar 23a corresponds to a second bonded portion to which the switching devices (second switching devices) 28u-1 and 28u-2 and the diodes (second rectifying devices) 20c-u1 and 20c-u2 are bonded. The second portion 232b of the negative-electrode bus bar 23b corresponds to a third bonded portion at which the switching devices (the first switching devices) 29u-1 and 29u-2 and the diodes (the first rectifying devices) 20c-u3 and 20c-u4, which are arranged on the flat surface, are bonded.

The bent portion 233u is provided with a through hole 234u that penetrates through the U-phase bus bar 23u in the thickness direction of the U-phase bus bar 23u (in the direction facing the other of the bus bars 23). The through hole 234u is arranged between the first portion (the first bonded portion) 231a and the second portion (the second bonded portion) 232u. Similarly, the bent portion 233b is provided with through holes 234b that penetrate through the negative-electrode bus bar 23b in the thickness direction thereof (in the direction facing the other of the bus bars 23). The through holes 234u and 234b are formed in both of the two bus bars 23 arranged so as to face each other.

Parts of the resin molded portion 20b extend from the through holes 234u and 234b to the gap between the negative-electrode bus bar 23b and the U-phase bus bar 23u and to the gap between the U-phase bus bar 23u and the positive-electrode bus bar 23a.

In this case, in the power module 20, the proximity effect is increased by arranging the positive-electrode bus bar 23a and the negative-electrode bus bar 23b in close proximity. Electrical current flows in opposite directions in the positive-electrode bus bar 23a and the negative-electrode bus bar 23b. Mutual inductance is induced in the positive-electrode bus bar 23a and the negative-electrode bus bar 23b by mutual influence of the magnetic fields created by their respective electrical currents due to the proximity effect. As the mutual inductance is induced, self inductances in the positive-electrode bus bar 23a and the negative-electrode bus bar 23b are reduced by being cancelled out each other. Therefore, surge voltage caused at the time of switching is suppressed.

When the resin molded portion 20b is formed, molding material for forming the resin molded portion 20b is casted from the above. In this configuration, because the positive-electrode bus bar 23a, the U-phase bus bar 23u, and the negative-electrode bus bar 23b are arranged in close proximity, it is difficult to cast the molding material into gaps between respective bars. In addition, even if the molding material is casted from the side, because the switching devices and the diodes are disposed between the bus bars, they become obstructions for the casting of the molding material.

In contrast, in the power module 20, the through holes 234b are formed in the negative-electrode bus bar 23b, and the through hole 234u is formed in the U-phase bus bar 23u. Therefore, the molding material flows into the gap between the negative-electrode bus bar 23b and the U-phase bus bar 23u through the through holes 234b, and flows further into the gap between the U-phase bus bar 23u and the positive-electrode bus bar 23a through the through hole 234u. With such a configuration, it is possible to fill the gaps between the adjacent bus bars 23 with the molding material. Therefore, even when the bus bars 23 are arranged in close proximity to each other, it is possible to secure a mutually insulated state.

Note that, for example, only the negative-electrode bus bar 23b may be provided with the through holes 234b. Because the molding material is casted from the above, when the through hole is formed in only one of the bus bars 23 that are arranged so as to face each other, by forming the through hole 234b in the overlying bus bar (in this case, the negative-electrode bus bar 23b), it is possible to fill the gaps between the adjacent bus bars 23 with the molding material. As described above, the through hole is formed in at least one of the two bus bars 23 that are arranged so as to face each other.

The through hole 234u is provided in the bent portion 233u, and the through holes 234b are provided in the bent portion 233b. With such a configuration, it is possible to fill, with the molding material, the gap between the bent portion 233u and the bent portion 233b where it is relatively difficult to cast the molding material. In addition, the bent portions 233u and 233b are formed in the U-phase bus bar 23u and the negative-electrode bus bar 23b by performing a press forming in a state in which the through holes 234u and 234b are pre-formed, respectively, and therefore, it is easier to perform the bending because the through holes 234u and 234b have been provided in advance.

Instead of this configuration, for example, it may be possible to provide the through holes in the first portion 231u of the U-phase bus bar 23u and the first portion 231b of the negative-electrode bus bar 23b. Also in this case, it is possible to fill the gaps between the adjacent bus bars 23 with the molding material.

The through holes 234u and 234b are arranged such that at least parts thereof are overlapped in the thickness direction of the U-phase bus bar 23u and the negative-electrode bus bar 23b (in the direction in which the respective bus bars 23 face each other). In other words, as shown in FIG. 6, the through holes 234u and 234b are arranged such that at least parts thereof are overlapped when viewed in a planar view. Note that, the through holes 234u and 234b may be arranged such that entire holes are overlapped when viewed in a planar view.

With such a configuration, it is possible to even fill, with the molding material, the gap between the first portion 231b of the negative-electrode bus bar 23b and the first portion 231u of the U-phase bus bar 23u where it is relatively difficult to cast the molding material. In addition, in this case, it is possible to increase the proximity effect at a portion except the through holes 234u and 234b are formed.

Note that, the through holes 234u and 234b may formed such that they are not overlapped in the thickness direction of the U-phase bus bar 23u and the negative-electrode bus bar 23b. In this case, the molding material that has been introduced from the through holes 234b flows so as to spread along the top surface of the U-phase bus bar 23u, and thereby, it is possible to fill the gap between the positive-electrode bus bar 23a and the U-phase bus bar 23u with the molding material.

The U-phase bus bar 23u has the second portion 232u to which the switching devices 29u-1 and 29u-2 and the diodes 20c-u3 and 20c-u4 are bonded, and the positive-electrode bus bar 23a has the first portion 231a to which the switching devices 28u-1 and 28u-2 and the diodes 20c-u1 and 20c-u2 are bonded. The through holes 234u and 234b are arranged between the second portion 232u and the first portion 231a.

With such a configuration, it is possible to fill, with the molding material, the surroundings of the switching devices 28u-1, 28u-2, 29u-1, and 29u-2 and the diodes 20c-u1, 20c-u2, 20c-u3, and 20c-u4 where it is difficult to cast the molding material.

Figure 15:
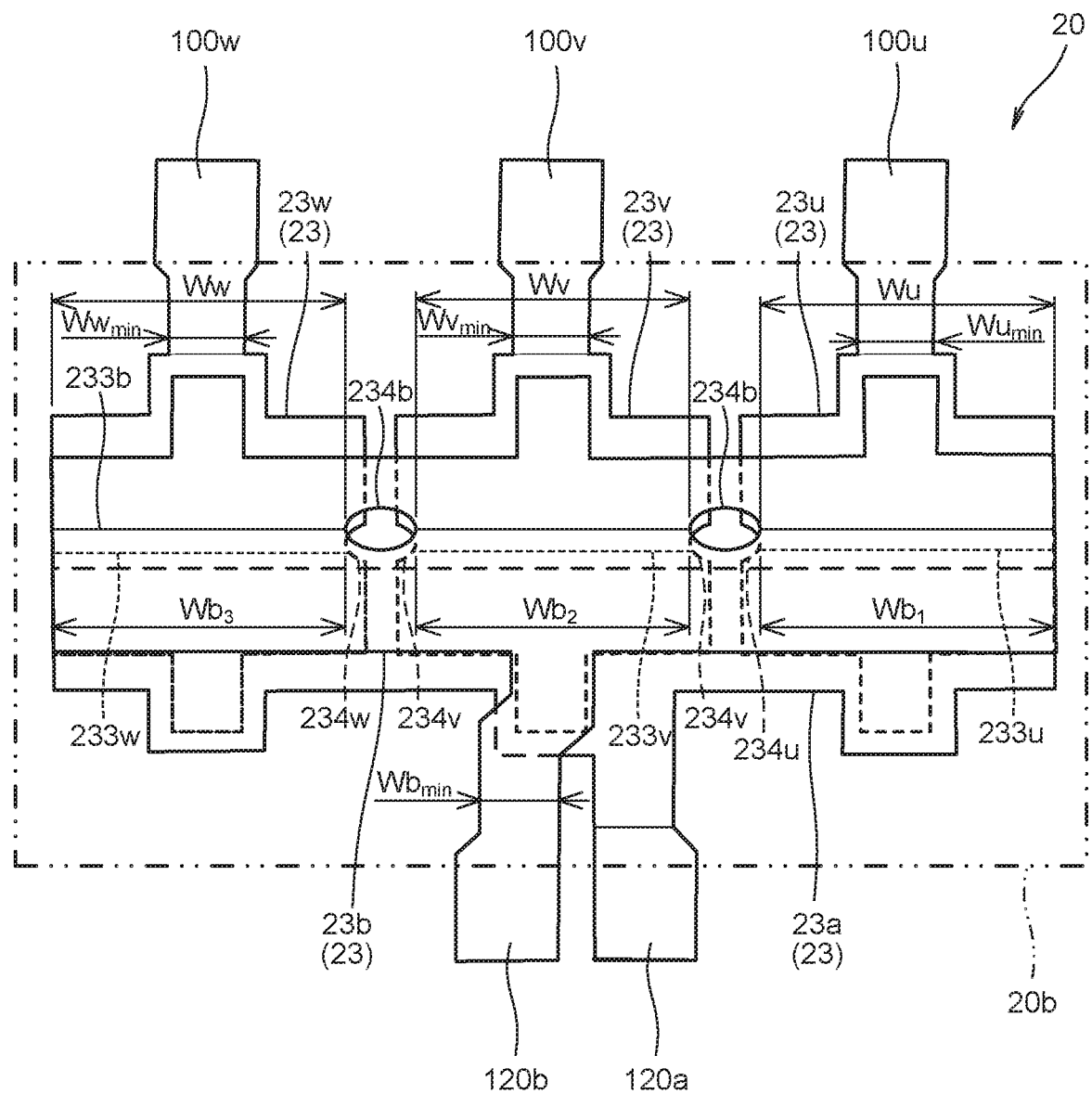
FIG. 15 is a plan view of conductive plates in the power module.

As shown in FIG. 15, in the U-phase bus bar 23u, the through hole 234u is provided in an end portion facing the gap between the U-phase bus bar 23u and the V-phase bus bar 23v that is arranged so as to be adjacent to the U-phase bus bar 23u. In the V-phase bus bar 23v, through holes 234v are respectively provided in an end portion facing the gap between the V-phase bus bar 23v and the U-phase bus bar 23u and in an end portion facing the gap between the V-phase bus bar 23v and the W-phase bus bar 23w. In the W-phase bus bar 23w, a through hole 234w is provided in an end portion facing the gap between the W-phase bus bar 23w and the V-phase bus bar 23v that is arranged so as to be adjacent to the W-phase bus bar 23w. In addition, in the negative-electrode bus bar 23b, a pair of through holes 234b are provided so as to respectively face the adjacent through holes 234u and 234v and the adjacent through holes 234v and 234w from the above.

With such a configuration, the molding material that has been casted through the through holes 234b flows through the gap between the U-phase bus bar 23u and the V-phase bus bar 23v and the gap between the V-phase bus bar 23v and the W-phase bus bar 23w. Thus, it is possible to fill the surroundings of the positive-electrode bus bar 23a with the molding material.

The widths Wu, Wv, and Ww of current flowable regions in the portions of the U-phase bus bar 23u, the V-phase bus bar 23v, and the W-phase bus bar 23w, in which the through holes 234u, 234v, and 234w are respectively formed, are respectively larger than the sizes of minimum-width portions $Wu_{min}$, $Wv_{min}$, and $Ww_{min}$ of the U-phase bus bar 23u, the V-phase bus bar 23v, and the W-phase bus bar 23w. In this configuration, base portions of the terminal portions 100u, 100v, and 100w are the minimum-width portions $Wu_{min}$, $Wv_{min}$, and $Ww_{min}$, respectively. With such a configuration, it is possible to prevent a resistance against flowing current from being increased by providing the through holes 234u, 234v, and 234w.

Similarly, a width Wb (Wb=$Wb_1$+$Wb_2$+$Wb_3$) of the current flowable region of the portion of the negative-electrode bus bar 23b, in which the through holes 234b are formed, is larger than the size of the minimum-width portion $Wb_{min}$ of the negative-electrode bus bar 23b. In this configuration, a base portion of the terminal portion 120b is the minimum-width portion Wb With such a configuration, it is possible to prevent the resistance against flowing current from being increased by providing the through holes 234b.

In the following, the power module 20 according to first to seventh modifications of the embodiment of the present invention will be described below with reference to FIGS. 16 to 22. In each of the modifications shown below, differences from the embodiment of the present invention described above will be mainly described, and components that have similar functions are assigned the same reference numerals and descriptions thereof will be omitted.

Figure 16:
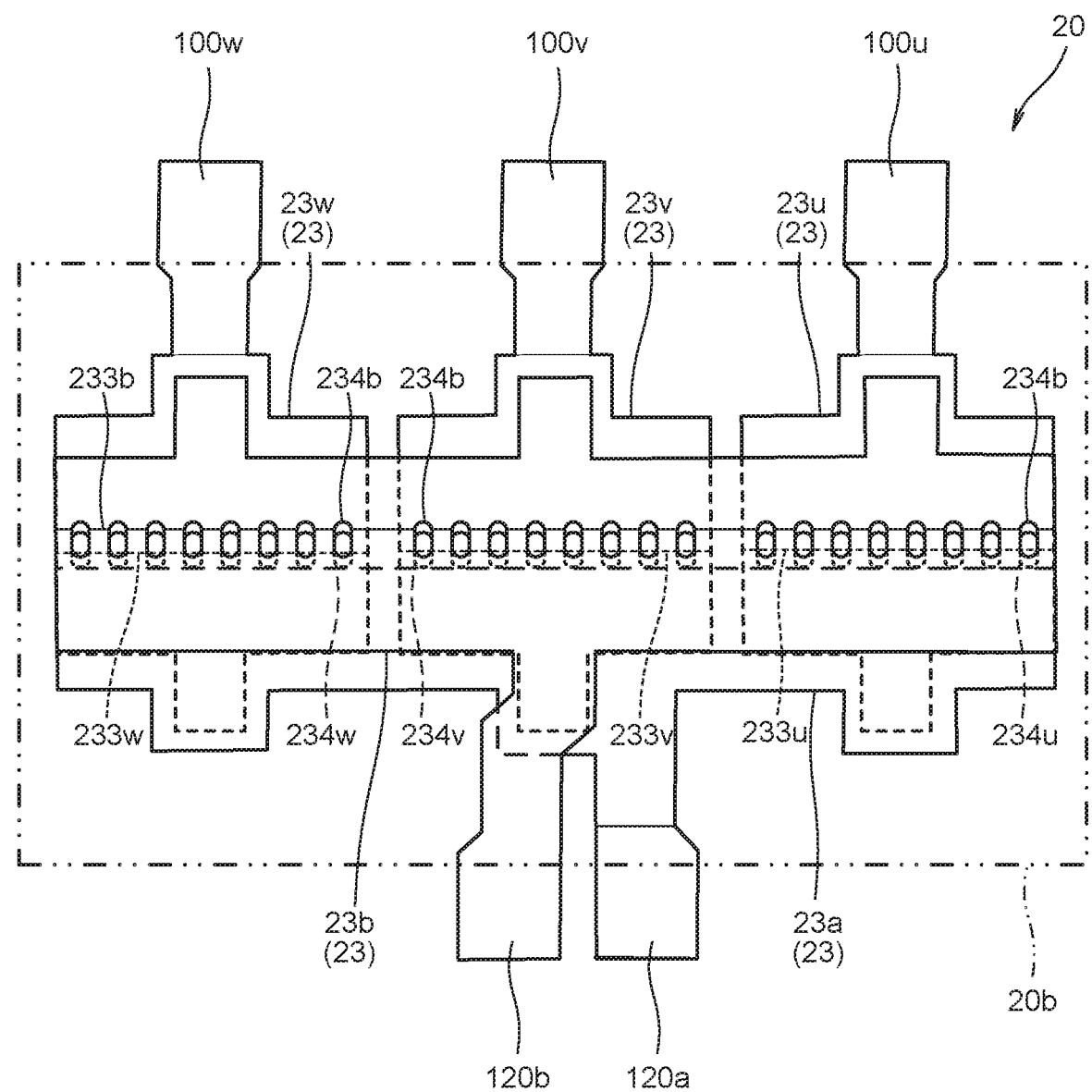
FIG. 16 is a plan view of the conductive plates in the power module according to a first modification.

In the first modification shown in FIG. 16, the U-phase bus bar 23u, the V-phase bus bar 23v, and the W-phase bus bar 23w respectively have many (in this case, eight) through holes 234u, 234v, and 234w. The through holes 234u, 234v, and 234w are respectively arranged at equal intervals in the width direction of the U-phase bus bar 23u, the V-phase bus bar 23v, and the W-phase bus bar 23w. The negative-electrode bus bar 23b also has many (in this case, twenty four) through holes 234b.

As described above, by providing many through holes 234u, 234v, 234w, and 234b, the molding material can flow into the gaps between the adjacent bus bars 23 more easily. Thus, it is possible to fill the gaps between the adjacent bus bars 23 with the molding material, and therefore, it is possible to secure a mutually insulated state even when the bus bars 23 are arranged in close proximity to each other.

Figure 17:
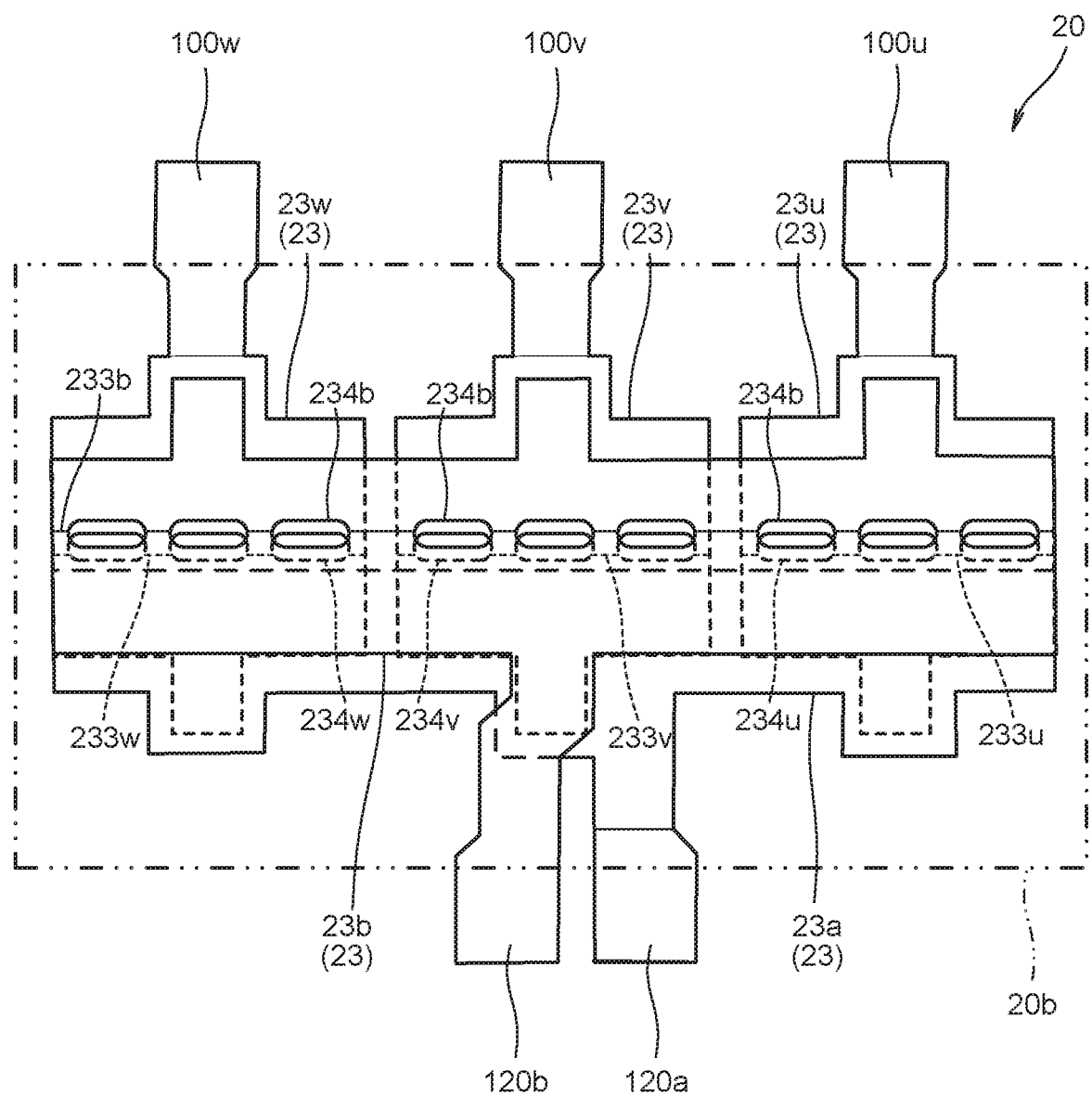
FIG. 17 is a plan view of the conductive plates in the power module according to a second modification.
Figure 18:
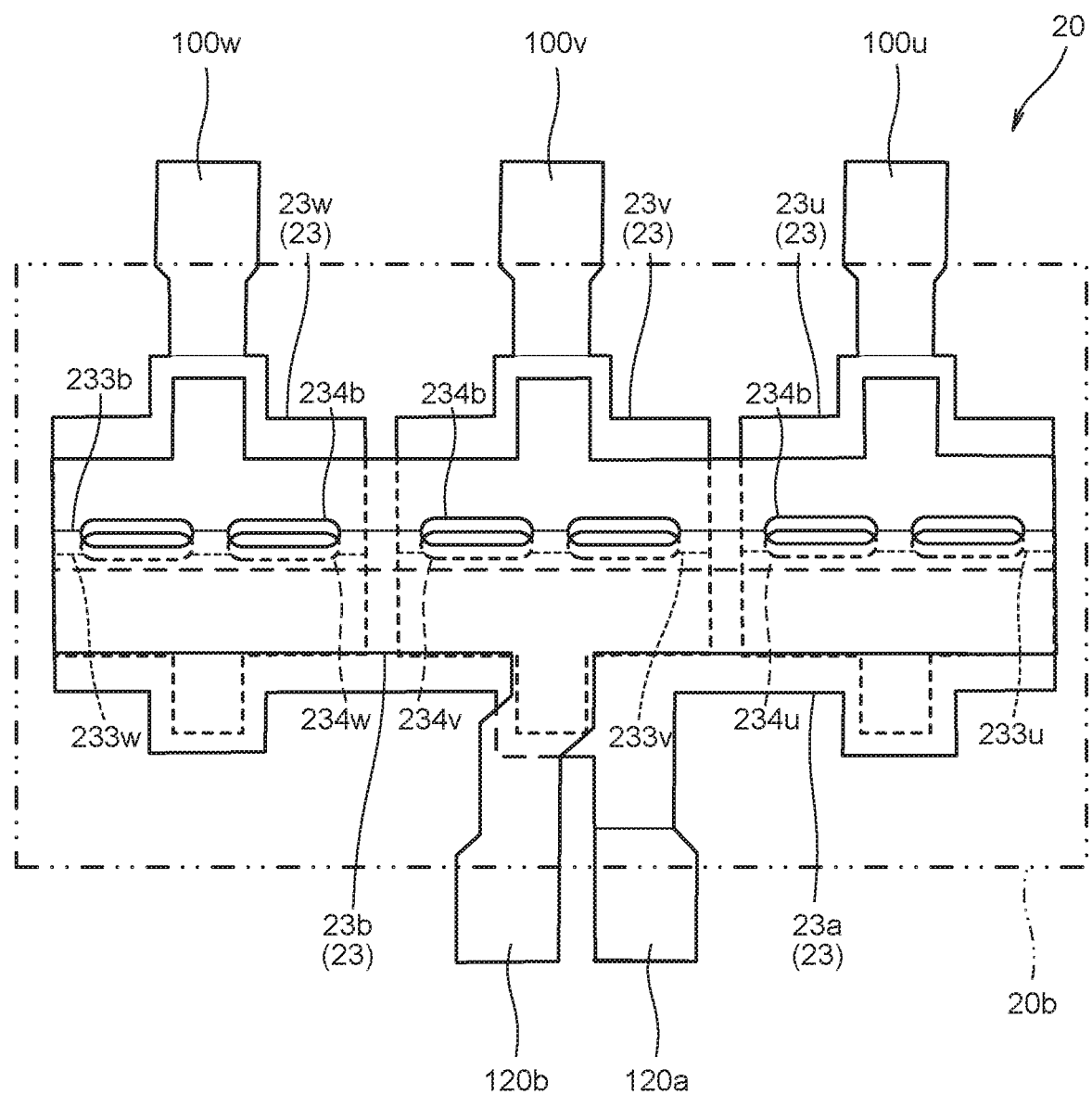
FIG. 18 is a plan view of the conductive plates in the power module according to a third modification.

Similarly, as in the second modification shown in FIG. 17, three through holes 234u, 234v, and 234w may be provided in the U-phase bus bar 23u, the V-phase bus bar 23v, and the W-phase bus bar 23w, respectively, and three through holes 234b may be provided in the negative-electrode bus bar 23b so as to correspond to each of the U-phase bus bar 23u, the V-phase bus bar 23v, and the W-phase bus bar 23w. In addition, as in the third modification shown in FIG. 18, pairs of through holes 234u, 234v, and 234w may be provided in the U-phase bus bar 23u, the V-phase bus bar 23v, and the W-phase bus bar 23w, respectively, and a pair of through holes 234b may be provided in the negative-electrode bus bar 23b so as to correspond to each of the U-phase bus bar 23u, the V-phase bus bar 23v, and the W-phase bus bar 23w. The similar effects as those of the first modification shown in FIG. 16 are afforded in these modifications.

Figure 19:
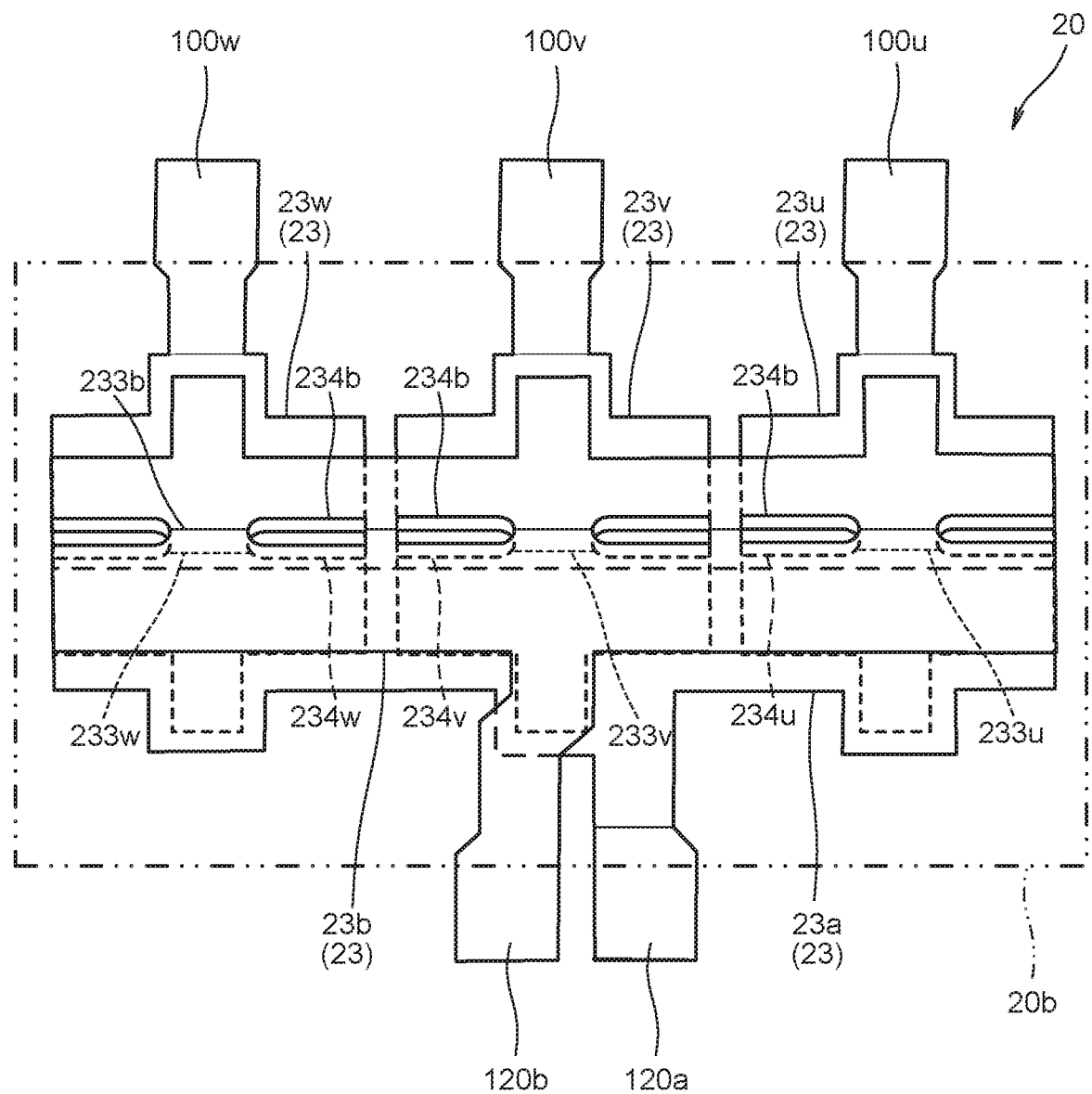
FIG. 19 is a plan view of the conductive plates in the power module according to a fourth modification.

In addition, as in the fourth modification shown in FIG. 19, a pair of through holes 234u, 234v, and 234w to be provided in the U-phase bus bar 23u, the V-phase bus bar 23v, and the W-phase bus bar 23w, respectively, may be provided on end portions facing the gap between the U-phase bus bar 23u and the V-phase bus bar 23v, and the gap between the V-phase bus bar 23v and the W-phase bus bar 23w that are arranged so as to be adjacent to each other. In the negative-electrode bus bar 23b, the through holes 234b are formed at positions overlapped with those of the through holes 234u, 234v, and 234w.

Figure 20:
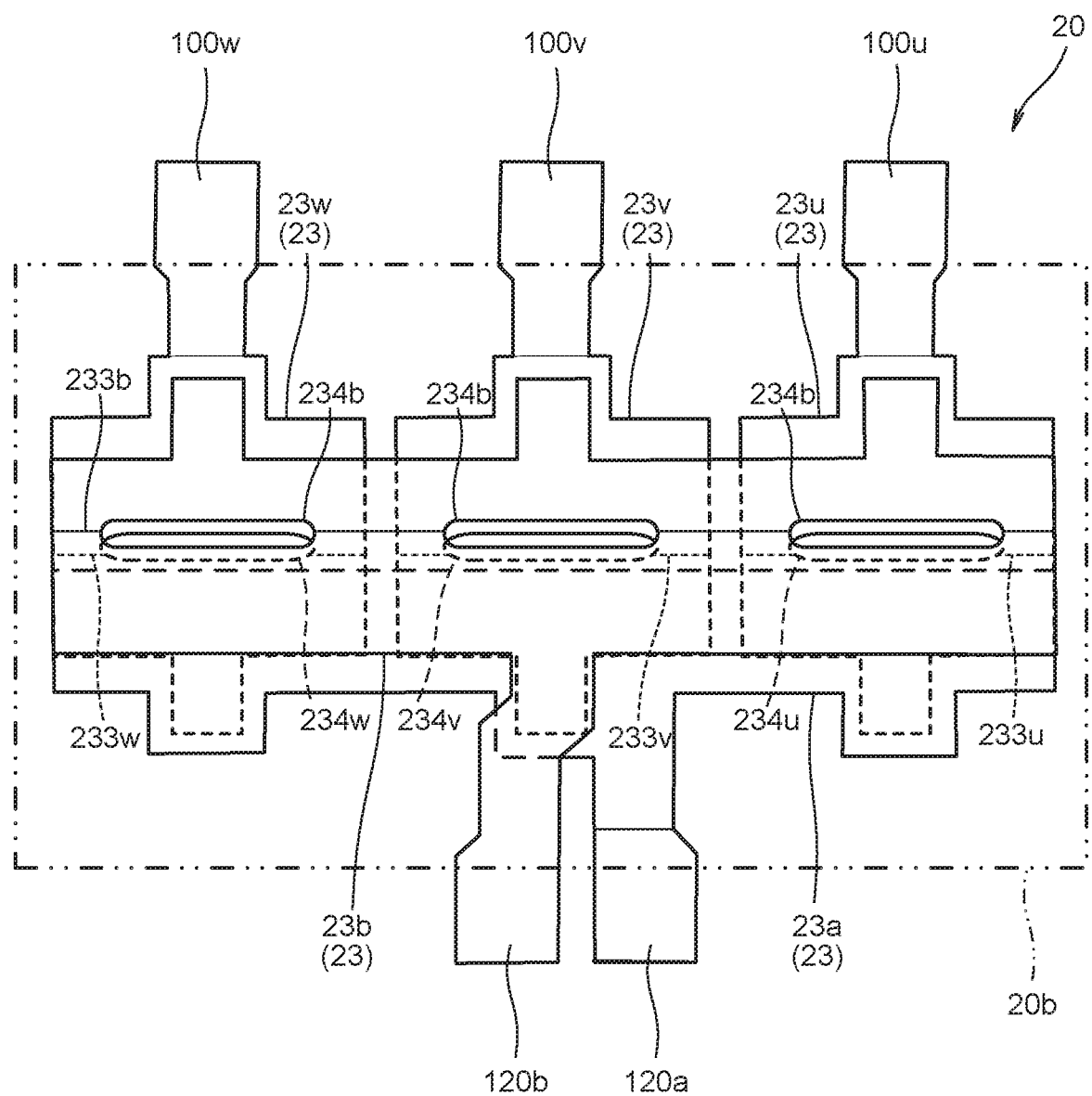
FIG. 20 is a plan view of the conductive plates in the power module according to a fifth modification.

In addition, as in the fifth modification shown in FIG. 20, a single through hole 234u, 234v, or 234w may be provided in each of the U-phase bus bar 23u, the V-phase bus bar 23v, and the W-phase bus bar 23w. In this case, the through holes 234u, 234v, and 234w are formed so as to have an elongated shape in the width direction of the U-phase bus bar 23u, the V-phase bus bar 23v, and the W-phase bus bar 23w. In the negative-electrode bus bar 23b, the through holes 234b are formed at positions overlapped with those of the through holes 234u, 234v, and 234w.

Figure 21:
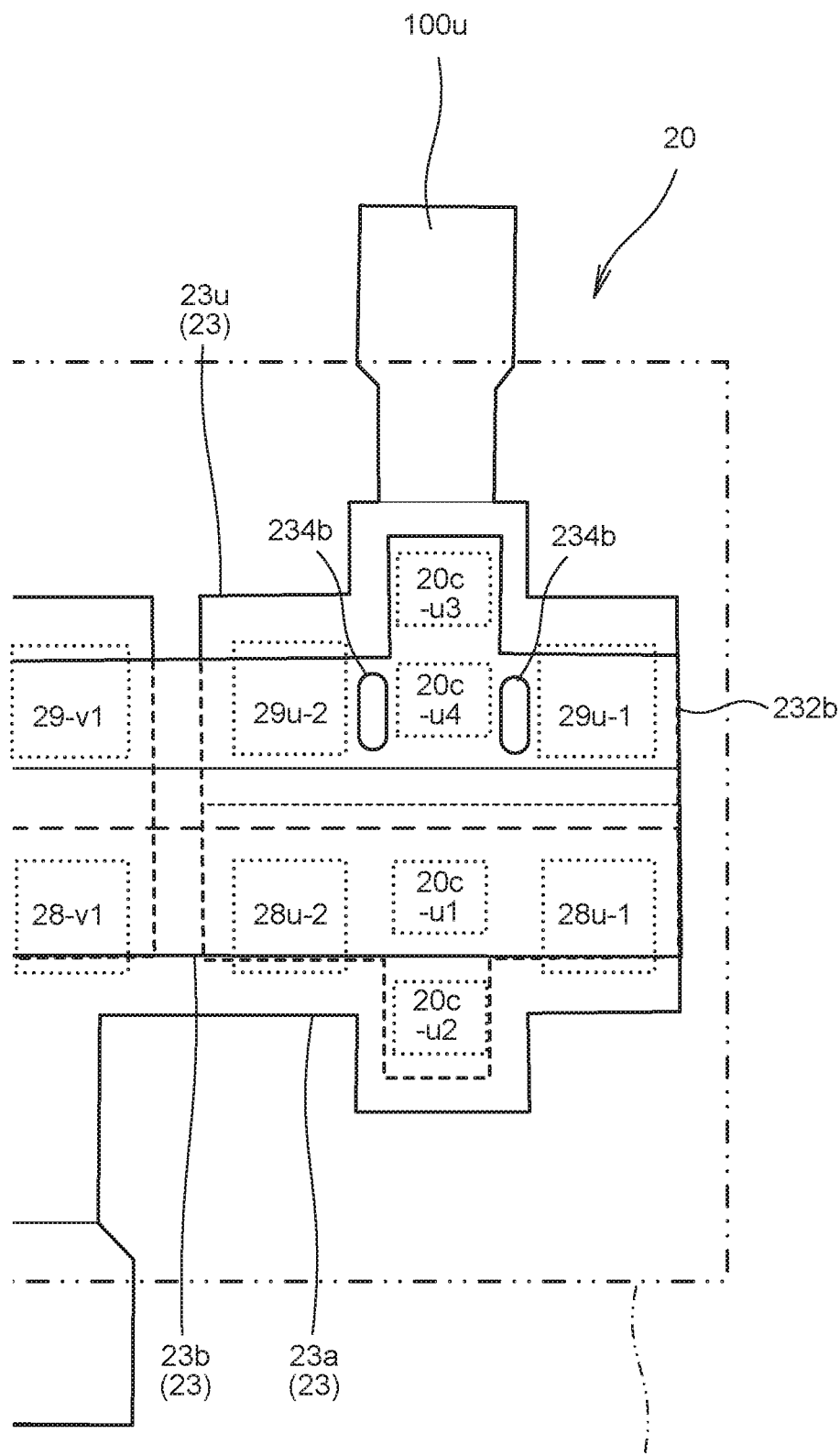
FIG. 21 is an enlarged plan view of the vicinities of the U-phase of the conductive plate in the power module according to a sixth modification.

In addition, as in the sixth modification shown in FIG. 21, for example, in the second portion 232b of the negative-electrode bus bar 23b, the through hole 234b may be formed between connected portions with the switching devices 29u-1 and 29u-2 and a bonded portion with the diodes 20c-u3 and 20c-u4. With such a configuration, it is also possible to fill narrow regions between the switching devices and the diodes with the molding material.

Figure 22:
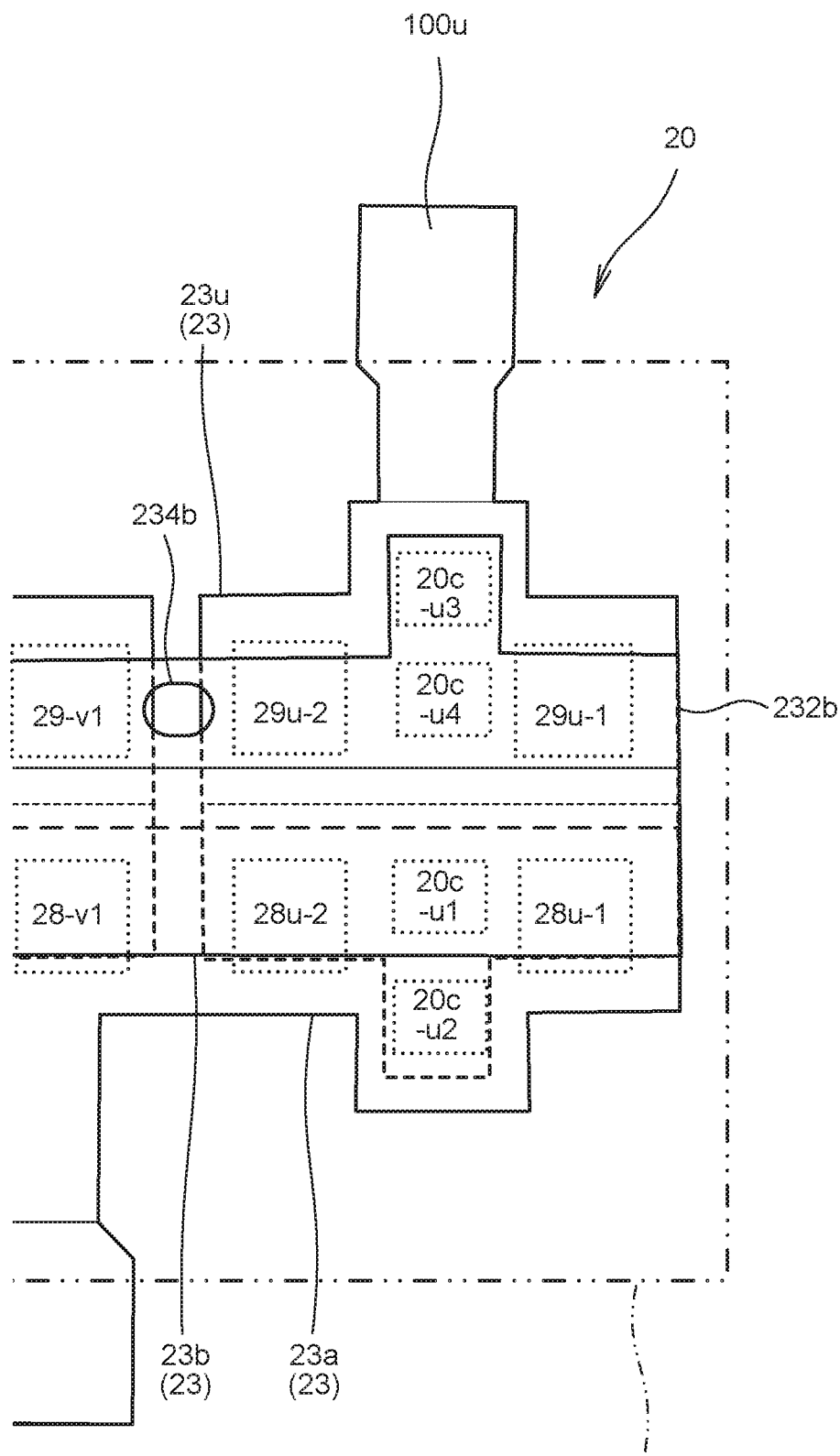
FIG. 22 is an enlarged plan view of the vicinities of the U-phase of the conductive plate in the power module according to a seventh modification.

Alternatively, as in the seventh modification shown in FIG. 22, in the second portion 232b of the negative-electrode bus bar 23b, the through hole 234b may be formed between the switching devices that are arranged so as to be adjacent to each other (for example, between the switching device 29u-2 and the switching device 29v-1). As described above, the through hole 234b may be formed between the switching device 29u-2 of the U-phase bus bar 23u and the switching device 29v-1 of the V-phase bus bar 23v that is arranged so as to be adjacent to the U-phase bus bar 23u.

As described above, even with the power module 20 according to the first to seventh modifications shown in FIGS. 16 to 22, the similar effects as those of the above-mentioned embodiment are afforded.

Note that, even in the first to seventh modifications, the widths of the current flowable regions in the portions of the U-phase bus bar 23u, the V-phase bus bar 23v, and the W-phase bus bar 23w, in which the through holes 234u, 234v, and 234w are respectively formed, are respectively larger than the sizes of the minimum-width portions of the U-phase bus bar 23u, the V-phase bus bar 23v, and the W-phase bus bar 23w. Similarly, the width of the current flowable region in the portion of the negative-electrode bus bar 23b, in which the through holes 234b are formed, is larger than the size of the minimum-width portion of the negative-electrode bus bar 23b.

With the power module 20 according to the above-mentioned embodiment, the advantages described below are afforded.

The power module 20 configured to convert direct-current electric power to alternating-current electric power includes: the plurality of bus bars 23; and the resin molded portion 20b configured to encapsulate the plurality of bus bars 23 in a state in which the terminal portions 100u, 100v, 100w, 120a, and 120b are exposed, wherein at least two of the plurality of bus bars 23 are arranged so as to face each other, at least one of the two bus bars 23 arranged so as to face each other has the through holes 234b, 234u, 234v, and 234w in a portion facing the other of the two bus bars 23, and a part of the resin molded portion 20b extends from the through holes 234b, 234u, 234v, and 234w to the gap between the two bus bars 23 arranged so as to face each other.

With such a configuration, because the through holes 234b, 234u, 234v, and 234w are formed in at least one of the bus bars 23, the molding material forming the resin molded portion 20b flows into the gaps between the bus bars 23 facing each other through the through holes 234b, 234u, 234v, and 234w. With such a configuration, it is possible to fill the gaps between the adjacent bus bars 23 with the molding material. Therefore, even when the bus bars 23 are arranged in close proximity to each other, it is possible to secure a mutually insulated state.

Embodiments of this invention were described above, but the above embodiments are merely examples of applications of this invention, and the technical scope of this invention is not limited to the specific constitutions of the above embodiments.

For example, in the examples shown in FIGS. 11A to 11C and FIGS. 13A to 13C, the terminal bases 93 and 393 are formed as separate bodies from the bottom portion 2c of the bottom case 2b. Instead of this configuration, the terminal bases 93 and 393 may be integrally formed with the bottom portion 2c of the bottom case 2b using a resin.

This application claims priority based on Japanese Patent Application No. 2016-089226 filed with the Japan Patent Office on Apr. 27, 2016, the entire contents of which are incorporated into this specification by reference.

The invention claimed is:

1. A semiconductor component comprising:
a semiconductor device;
an insulating molded portion configured to encapsulate the semiconductor device;
a terminal connected to the semiconductor device, the terminal being configured to project out from the insulating molded portion; and
a cooler mounted with the insulating molded portion such that the semiconductor device is cooled; wherein
a recessed portion is formed in a surface of the cooler on which the insulating molded portion is mounted so as to extend from a position facing the terminal to a position at inner side of an end portion of the insulating molded portion,
the recessed portion is provided with a terminal base, the terminal base being provided between the recessed portion and the terminal so as to support the terminal.

2. The semiconductor component according to claim 1, wherein
the insulating molded portion has a recessed portion in a portion facing the recessed portion of the cooler.

3. The semiconductor component according to claim 2, wherein
the terminal base has a protruded portion, the protruded portion being inserted into the recessed portion of the insulating molded portion.

4. The semiconductor component according to claim 1, wherein
the cooler has:
a first cooling medium flow channel through which the cooling medium flows to cool the semiconductor device; and
a second cooling medium flow channel through which the cooling medium flows to cool a separate device from the semiconductor device, and
the recessed portion of the cooler is positioned between the first cooling medium flow channel and the second cooling medium flow channel.

5. A power module applied to the semiconductor component according to claim 1 and configured to convert direct-current electric power to alternating-current electric power, the power module comprises:
a plurality of conductive plates formed of a first conductive plate having an alternating-current terminal, a second conductive plate having a positive direct-current terminal, and a third conductive plate having a negative direct-current terminal; and
the insulating molded portion configured to encapsulate the plurality of conductive plates in a state in which the alternating-current terminal, the positive direct-current terminal, and the negative direct-current terminal are exposed, wherein at least two of the plurality of conductive plates are arranged so as to face each other, at least one of the two conductive plates arranged so as to face each other has a through hole in a portion facing the other of the two conductive plates, and a part of the insulating molded portion extends from the through hole to a gap between the two conductive plates arranged so as to face each other.

6. A power module according to claim 5, wherein the through hole is formed in an overlaying conductive plate of the two conductive plates arranged so as to face each other.

7. The power module according to claim 5, wherein the through holes are formed in both of the two conductive plates arranged so as to face each other.

8. The power module according to claim 7, wherein the through holes are arranged such that at least parts thereof are overlapped in the direction in which the conductive plates face each other.

9. The power module according to claim 7, wherein the conductive plate has a bent portion having a bent shape, and the through hole is formed in the bent portion.

10. The power module according to 5, wherein the first conductive plate has a first bonded portion to which a first switching device and a first rectifying device are bonded, the second conductive plate has a second bonded portion to which a second switching device and a second rectifying device are bonded, and the through hole is arranged between the first bonded portion and the second bonded portion.

11. The power module according to claim 10, wherein the first conductive plate is connected to the second switching device and the second rectifying device, the third conductive plate is connected to the first switching device and the first rectifying device, and the through holes are formed in the first conductive plate and the third conductive plate.

12. The power module according to claim 10, wherein the third conductive plate has a third bonded portion to which the first switching device and the first rectifying device are bonded, the first switching device and the first rectifying device being arranged on a flat surface, and the through hole is formed in the third bonded portion between the bonded portion with the first switching device and the bonded portion with the first rectifying device.

13. The power module according to claim 12, wherein a plurality of the first conductive plates are provided in correspondence to respective phases, the third conductive plate has the third bonded portion to which the first switching device and the first rectifying device are bonded, the first switching device and the first rectifying device being arranged on a flat surface, and the through hole is formed in the third bonded portion between a bonded portion with the first switching device of one of the first conductive plates and a bonded portion with the first switching device of another of the first conductive plates, the other of the first conductive plates being adjacent to the one of the first conductive plates.

14. The power module according to claim 5, wherein a width of a current flowable region in a portion of the conductive plate, in which the through hole is formed, is larger than a size of a minimum-width portion of the conductive plate.

\* \* \* \* \*